United States Patent
Yun et al.

(10) Patent No.: US 10,446,580 B2
(45) Date of Patent: Oct. 15, 2019

(54) MEMORY DEVICE

(71) Applicant: SAMSUNG ELECTRONICS CO., LTD., Suwon-si, Gyeonggi-do (KR)

(72) Inventors: Jang Gn Yun, Hwaseong-S (KR); Sun Young Kim, Seongnam-si (KR); Hoo Sung Cho, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/298,349

(22) Filed: Mar. 11, 2019

(65) Prior Publication Data
US 2019/0206891 A1 Jul. 4, 2019

Related U.S. Application Data

(63) Continuation of application No. 15/463,138, filed on Mar. 20, 2017, now Pat. No. 10,242,999.

(30) Foreign Application Priority Data

Sep. 19, 2016 (KR) .................. 10-2016-0119427

(51) Int. Cl.
| H01L 27/11582 | (2017.01) |
| H01L 27/11575 | (2017.01) |
| H01L 27/1157 | (2017.01) |
| H01L 27/11565 | (2017.01) |
| H01L 27/11556 | (2017.01) |
| H01L 23/528 | (2006.01) |
| H01L 23/522 | (2006.01) |

(52) U.S. Cl.
CPC ...... *H01L 27/11582* (2013.01); *H01L 23/528* (2013.01); *H01L 23/5226* (2013.01); *H01L 27/1157* (2013.01); *H01L 27/11556* (2013.01); *H01L 27/11565* (2013.01); *H01L 27/11575* (2013.01)

(58) Field of Classification Search
CPC ............. H01L 23/528; H01L 27/11565; H01L 23/5226
See application file for complete search history.

(56) References Cited

U.S. PATENT DOCUMENTS

| 4,956,314 A | 9/1990 | Tam et al. |
| 8,634,246 B2 | 1/2014 | Kang et al. |

(Continued)

FOREIGN PATENT DOCUMENTS

KR 0827450 B1 4/2008

*Primary Examiner* — Amar Movva
(74) *Attorney, Agent, or Firm* — Volentine, Whitt & Francos, PLLC

(57) ABSTRACT

A memory device includes a pair of common source lines disposed on a substrate spaced apart from each other and extended in a first direction; a plurality of ground select lines disposed between the pair of common source lines, extended in the first direction, and disposed on the same level; a plurality of word lines disposed on the plurality of ground select lines between the pair of common source lines, extended in the first direction, and disposed on the same level, at least a portion of the plurality of word lines being connected by a connection electrode; and a plurality of first separation insulating patterns disposed between individual ground select lines of a portion of the plurality of ground select lines and extended in the first direction. The at least portion of the plurality of word lines is connected by a connection electrode.

20 Claims, 30 Drawing Sheets

(56) References Cited

U.S. PATENT DOCUMENTS

| | | |
|---|---|---|
| 9,281,019 B2 | 3/2016 | Park et al. |
| 2008/0283905 A1 | 11/2008 | Won |
| 2014/0347927 A1 | 11/2014 | Kim et al. |
| 2015/0137216 A1 | 5/2015 | Lee et al. |
| 2015/0332771 A1 | 11/2015 | Kwon et al. |
| 2016/0005748 A1 | 1/2016 | Chen |

MEMORY DEVICE

CROSS-REFERENCE TO RELATED APPLICATION

This is a Continuation of U.S. application Ser. No. 15/463,138, filed Mar. 20, 2017, in which a claim for priority under 35 U.S.C. § 119 is made to Korean Patent Application No. 10-2016-0119427 filed on Sep. 19, 2016 in the Korean Intellectual Property Office, the disclosure of which is incorporated herein in its entirety by reference.

BACKGROUND

The inventive concepts described herein relate to memory devices.

Although electronic products and devices have gradually been decreased in size, the requirement of electronic products to process high-capacity data remains. As a result, the required degree of semiconductor memory device integration in electronic products has necessarily increased. In order to increase the degree of integration, memory devices having vertical transistor structures rather than planar transistor structures have been proposed.

SUMMARY

Embodiments of the inventive concept provide a memory device having excellent reliability.

Embodiments of the inventive concept provide a memory device including a pair of common source lines disposed on a substrate spaced apart from each other and extending in a first direction; a plurality of ground select lines disposed between the pair of common source lines, extending in the first direction, and disposed on a same first level; a plurality of word lines disposed above the plurality of ground select lines between the pair of common source lines, extending in the first direction, and disposed on a same second level, at least a portion of the plurality of word lines being connected by a connection electrode; and a plurality of first separation insulating patterns disposed between individual ground select lines from among the plurality of ground select lines, and extending in the first direction.

Embodiments of the inventive concept provide a memory device including a pair of common source lines disposed on a substrate spaced apart from each other and extending in a first direction; a plurality of ground select lines disposed between the pair of common source lines, extending in the first direction, and disposed on a same first level; a plurality of word lines disposed above the plurality of ground select lines between the pair of common source lines and disposed on a same level; a plurality of first separation insulating patterns disposed between individual ground select lines from among the plurality of ground select lines; and a dummy channel structure extending in a direction perpendicular to an upper surface of the substrate and penetrating through at least a portion of the plurality of word lines. The dummy channel structure is disposed to overlap the plurality of first separation insulating patterns.

Embodiments of the inventive concept provide a memory device including a pair of common source lines disposed on a substrate spaced apart from each other and extending in a first direction; a plurality of ground select lines disposed between the pair of common source lines, extending in a first direction and disposed on a same first level; a plurality of first word lines disposed above the plurality of ground select lines between the pair of common source lines, and disposed on a same second level; and a plurality of second word lines disposed above the plurality of first word lines between the pair of common source lines, and disposed on a same third level. At least one of the plurality of first word lines includes a portion that extends along the first direction beyond a corresponding one of the plurality of second word lines directly above the at least one of the plurality of first word lines.

BRIEF DESCRIPTION OF DRAWINGS

The above and other aspects, features and advantages of the present inventive concept will be more clearly understood from the following detailed description when taken in conjunction with the accompanying drawings, in which.

DETAILED DESCRIPTION

Hereinafter, embodiments of the inventive concept will be described as follows with reference to the attached drawings.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
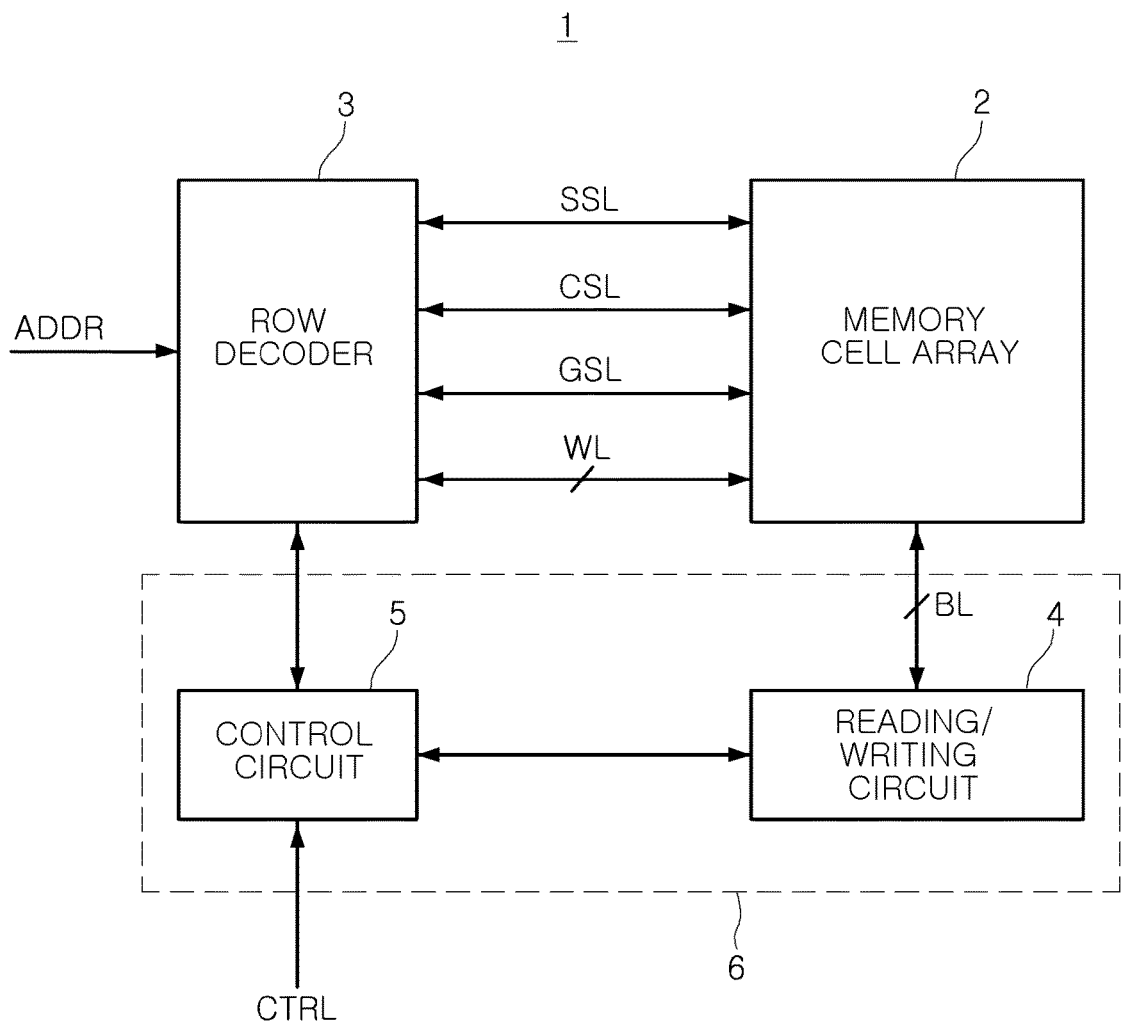
FIG. 1 illustrates a schematic block diagram of a memory device according to an embodiment of the inventive concept.

FIG. 1 illustrates a schematic block diagram of memory device 1 according to an embodiment of the inventive concept. Referring to FIG. 1, memory device 10 includes a memory cell array 2, a row decoder 3, and a core logic circuit 6. The core logic circuit 6 includes a reading/writing circuit 4 and a control circuit 5.

The memory cell array 2 may include a plurality of memory cells arrayed in a plurality of rows and columns. The plurality of memory cells included in the memory cell array 2 may for example be connected to the row decoder 3 by word lines (WL), a common source line (CSL), string select lines (SSL), ground select lines (GSL), and other various lines, and may be connected to the reading/writing circuit 4 by bit lines (BL). In some embodiments, the plurality of memory cells arrayed in the same row may be connected to a common WL, while the plurality of memory cells arrayed in the same column may be connected to a common BL.

The plurality of memory cells included in the memory cell array 2 may be divided into a plurality of memory blocks. Respective memory blocks may include a plurality of WLs, a plurality of SSLs, a plurality of GSLs, a plurality of BLs, and at least one CSL.

The row decoder 3 may receive address information ADDR from an external source such as a host for example, decode the received address information ADDR, and determine a voltage supplied to at least a portion of the WLs, the CSL, the SSLs, and the GSLs connected to the memory cell array 2.

The reading/writing circuit 4 may select at least a portion of the BLs connected to the memory cell array 2 according to a command received by the control circuit 5. The reading/writing circuit 4 may read data stored in a memory cell connected to at least one selected portion of the BLs or may record data in the memory cell connected to the at least one selected portion of the BLs. In order to perform operations as described above, the reading/writing circuit 4 may include circuits such as for example a page buffer, an input/output buffer, and a data latch among other circuits.

The control circuit 5 may control an operation of the row decoder 3 and the reading/writing circuit 4 in response to a control signal CTRL transmitted from an external source such as a host for example. In a case in which data stored in the memory cell array 2 is to be read, the control circuit 5 may control the operation of the row decoder 3 to enable a voltage required for a reading operation to be supplied to the WL storing the data to be read. In a case in which the voltage required for the reading operation is supplied to a specific WL, the control circuit 5 may provide control to enable the reading/writing circuit 4 to read data stored in the memory cell connected to the WL receiving the voltage required for the reading operation.

In the meantime, in a case in which data is to be written to the memory cell array 2, the control circuit 5 may control the operation of the row decoder 3 to enable a voltage required for a writing operation to be supplied to the WL to write the data. In a case in which the voltage required for the writing operation is supplied to a specific WL, the control circuit 5 may control the reading/writing circuit 4 to enable data to be written to the memory cell connected to the WL receiving the voltage required for the writing operation.

Figure 2:
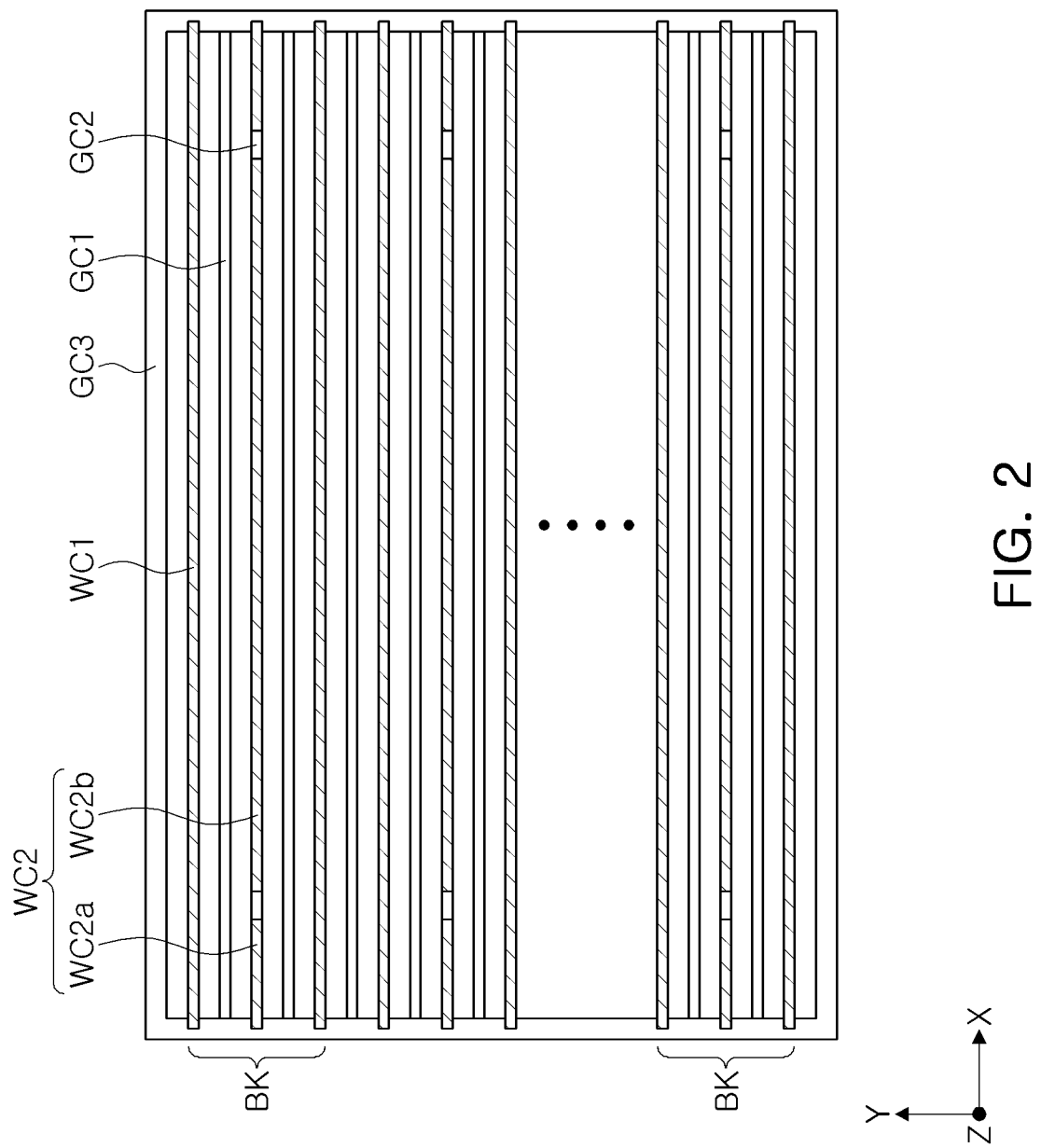
FIG. 2 illustrates a view of a layout of a memory device according to an embodiment of the inventive concept.

FIG. 2 illustrates a view of a layout of a memory device according to an embodiment of the inventive concept.

Although the memory cell array 2 illustrated in FIG. 1 may include a plurality of cell regions, for the sake of convenience FIG. 2 illustrates a view of a single cell region. FIG. 2 illustrates only mask patterns corresponding to a component of the memory device illustrated in FIG. 3, for the sake of convenience.

Figure 3:
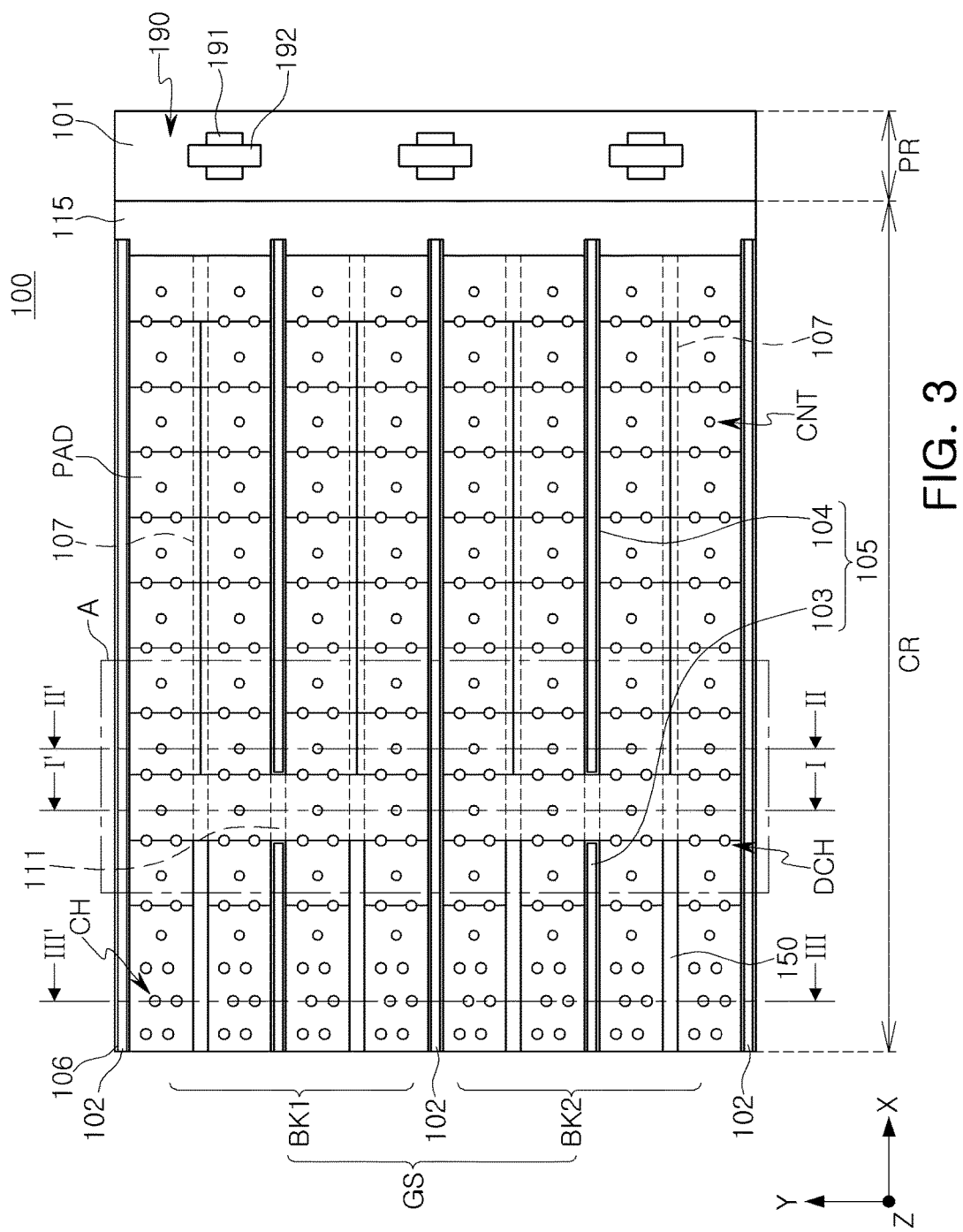
FIG. 3 illustrates a schematic top view of a memory device according to an embodiment of the inventive concept.

A first word line cut WC1 may be provided as a mask pattern to form a common source line 102 in FIG. 3, while a second word line cut WC2 may be provided as a mask pattern to form a first conductive line 105 in FIG. 3. A first ground select line cut GC1 may be provided as a mask pattern to form a first separation insulating pattern 107 in FIG. 3. In addition, a second ground select line cut GC2 may be provided as a mask pattern to form a second separation insulating pattern 111 in FIG. 3. A third ground select line cut GC3 may be provided as a mask pattern to define a single cell region.

A single cell region may include a plurality of blocks BK. A single block BK may be defined by a pair of first word line cuts WC1. Two first word line cuts WC1 may be disposed in a single block BK, while the second word line cut WC2 may be disposed between the two first word line cuts WC1. The second word line cut WC2 may include a first portion WC2a and a second portion WC2b, disposed to be spaced apart from each other. A region in which the first portion WC2a of the second word line cut WC2 is disposed to be spaced apart from the second portion WC2b of the second word line cut WC2 may overlap the second ground select line cut GC2.

FIG. 3 illustrates a schematic top view of a memory device according to an embodiment of the inventive concept.

With reference to FIG. 3, a memory device 100 according to an embodiment of the inventive concept includes a cell region CR and a peripheral circuit region PR. The cell region CR may include a plurality of gate electrode layers, a plurality of cell channel structures CH, a plurality of dummy channel structures DCH, and a plurality of contact plugs CNT. The cell region CR may also include a plurality of common source lines 102, a plurality of first conductive lines 105, a plurality of first separation insulating patterns 107, a plurality of second separation insulating patterns 111, a third separation insulating pattern 115, and a fourth separation insulating pattern 150. The peripheral circuit region PR may include a plurality of circuit devices 190, while a circuit device 190 may be provided as a transistor including an active region 191 and a gate 192. An etch stop layer covering a plurality of circuit devices 190 and a substrate 101 may be disposed on the peripheral circuit region PR. In detail, the etch stop layer may include a silicon nitride.

The cell region CR may include a gate structure GS divided into a plurality of blocks BK1 and BK2. The gate structure GS may include a plurality of gate electrode layers stacked on the substrate 101. The plurality of gate electrode layers may be stacked in a direction (Z direction) perpendicular to an upper surface (X-Y plane) of a substrate in an embodiment illustrated in FIG. 4. In addition, respective mold insulating layers may be disposed between the plurality of gate electrode layers, so that the plurality of gate electrode layers may be electrically isolated from each other in the z direction. The plurality of gate electrode layers may function as SSLs, WLs, and GSLs. In some embodiments of the inventive concept, the plurality of gate electrode layers may function as respective dummy word lines between an SSL and a WL, or between a GSL and a WL. At least a portion of the plurality of gate electrode layers may extend in a first direction (X direction) to have a different length than other of the gate electrode layers, in order to provide pad regions PAD connected to contact plugs CNT.

In the meantime, the memory device 100, according to embodiments of the inventive concept, may include a plurality of cell channel structures CH and a plurality of dummy channel structures DCH, disposed to be spaced apart from each other, on an X-Y plane. A dummy channel structure DCH may not be electrically connected to a BL, in contrast to a cell channel structure CH which is electrically connected to a BL. The plurality of cell channel structures CH and the plurality of dummy channel structures DCH may extend in a direction (Z direction) perpendicular to the upper surface (X-Y plane) of the substrate 101, and may penetrate through the plurality of gate electrode layers and the plurality of mold insulating layers. The dummy channel structure DCH may be provided to secure structural stability of the memory device 100 in a manufacturing process. In addition, the dummy channel structure DCH may be disposed adjacently to an edge of the pad region PAD of each gate electrode layer, as illustrated in FIG. 3.

The gate structure GS may be divided into the plurality of blocks BK1 and BK2 by the plurality of common source lines 102 extending in the first direction (X direction in FIG. 3). Although only two blocks BK1 and BK2 are shown in FIG. 3, the gate structure GS may include any integer number of blocks greater than 1. Respective blocks BK1 and BK2 may be defined by a pair of common source lines 102. In the respective blocks BK1 and BK2, a portion of the plurality of gate electrode layers functioning as WLs are divided into two unit electrodes by a first conductive line 105 extending in the first direction (X direction in FIG. 3). In the respective blocks BK1 and BK2, a portion of the plurality of gate electrode layers functioning as SSLs are divided into four unit electrodes by the first conductive line 105 and the fourth separation insulating pattern 150, extending in the first direction (X direction in FIG. 3). In the respective blocks BK1 and BK2, a portion of the plurality of gate electrode layers functioning as GSLs are divided into four unit electrodes by a first separation insulating pattern 107, a second separation insulating pattern 111, and a first conductive line 105, extending in the first direction (X direction in FIG. 3).

The first conductive line 105 includes a first portion 103 and a second portion 104, disposed to be spaced apart from each other in the first direction. In the respective blocks BK1 and BK2, two unit electrodes disposed on the same level may be connected by a connection electrode (not illustrated). That is, at least a portion of a first unit electrode and a portion of second unit electrode next to the first unit electrode and disposed on the same level, are connected by a connection electrode. The connection electrode may be disposed between the first portion 103 and the second portion 104, included in the first conductive line 105.

Structures of the plurality of gate electrode layers included in the memory device 100, according to embodiments of the inventive concept, will be subsequently described in detail with reference to FIGS. 9 to 15.

Figure 4:
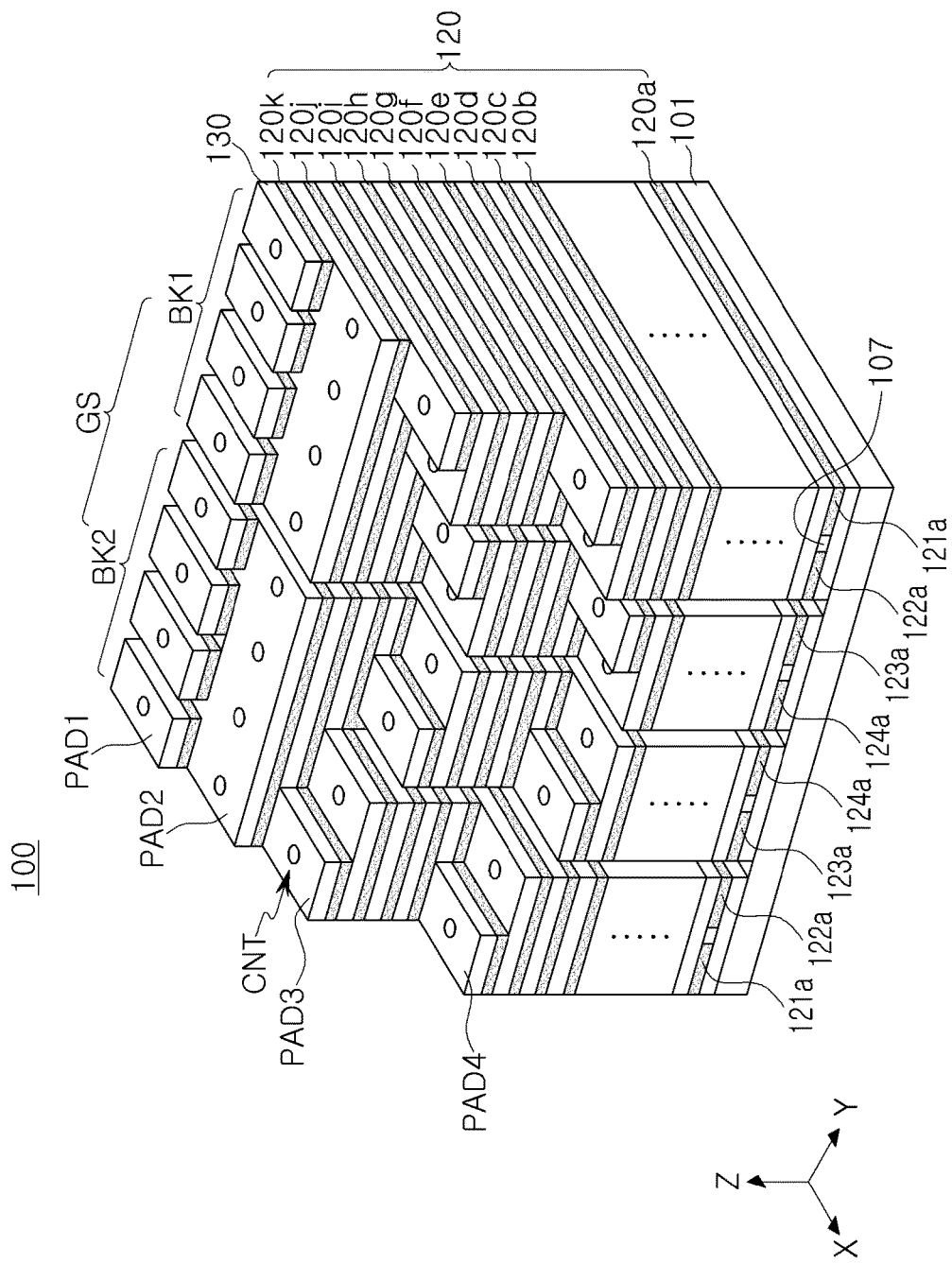
FIG. 4 illustrates a perspective view of region "A" of the memory device illustrated in FIG. 3.

FIG. 4 illustrates a perspective view of region "A" of the memory device illustrated in FIG. 3.

With reference to FIG. 4, a gate structure GS, including a plurality of gate electrode layers 120 (e.g., gate electrode layers 120a to 120k) and a plurality of mold insulating layers 130, is disposed on a substrate 101. In the gate structure GS, the plurality of gate electrode layers 120 and the plurality of mold insulating layers 130 are alternately stacked in a stacking direction (Z direction in FIG. 4).

The plurality of gate electrode layers 120 may be paired with the plurality of mold insulating layers 130, respectively, and may extend in a first direction (X direction in FIG. 4) by different amounts, thus providing a plurality of pad regions PAD1 to PAD4 including (or as) a step. The plurality of pad regions PAD1 to PAD4 may forma first stepped structure in the first direction. As illustrated in FIG. 4, a third pad region PAD3 may have (or be formed as) a step with respect to a different third pad region PAD3 disposed adjacently thereto, and may form a second stepped structure in a second direction (Y direction in FIG. 4). In a manner similar to a case described above, a fourth pad region PAD4 may have (or be formed as) a step with respect to a different fourth pad region PAD4 disposed adjacently thereto, and may form the second stepped structure in the second direction (Y direction in FIG. 4). The gate structure GS includes a first block BK1 and a second block BK2. The first block BK1 and the second block BK2 may be mirror images of one another. In an embodiment of the inventive concept, the first block BK1 and the second block BK2 may have the same structure. Contact plugs CNT are disposed on the plurality of pad regions PAD1 to PAD4, and portions of the contact plugs CNT are conveniently shown in FIG. 4.

The plurality of gate electrode layers 120 include a gate electrode layer 120a functioning as GSLs, gate electrode layers 120b to 120i functioning as WLs, and a gate electrode layer 120k functioning as SSLs, stacked from an upper surface of the substrate 101 in sequence. A gate electrode layer 120j functioning as a dummy word line may be disposed between the gate electrode layer 120i and the gate electrode layer 120k.

In the respective blocks BK1 and BK2, the gate electrode layer 120a disposed in the lowermost portion of the gate electrode layers 120 is shown as including first separation insulating patterns 107 disposed between first unit electrodes 121a and second unit electrodes 122a, and between third unit electrodes 123a and fourth unit electrodes 124a.

In some embodiments, a plurality of gate electrode layers 120b to 120i may have a step that extends along an entirety of the first direction (X direction) and the second direction (Y direction). In some embodiments, a plurality of third pad regions PAD3 disposed at similar positions in the first direction in the first and second blocks BK1 and BK2 may have (or be formed as) a step in the second direction. In a manner similar to a case described above, a plurality of fourth pad regions PAD4 disposed at similar positions in the first direction may have (or be formed as) a step in the second direction.

Figure 5:
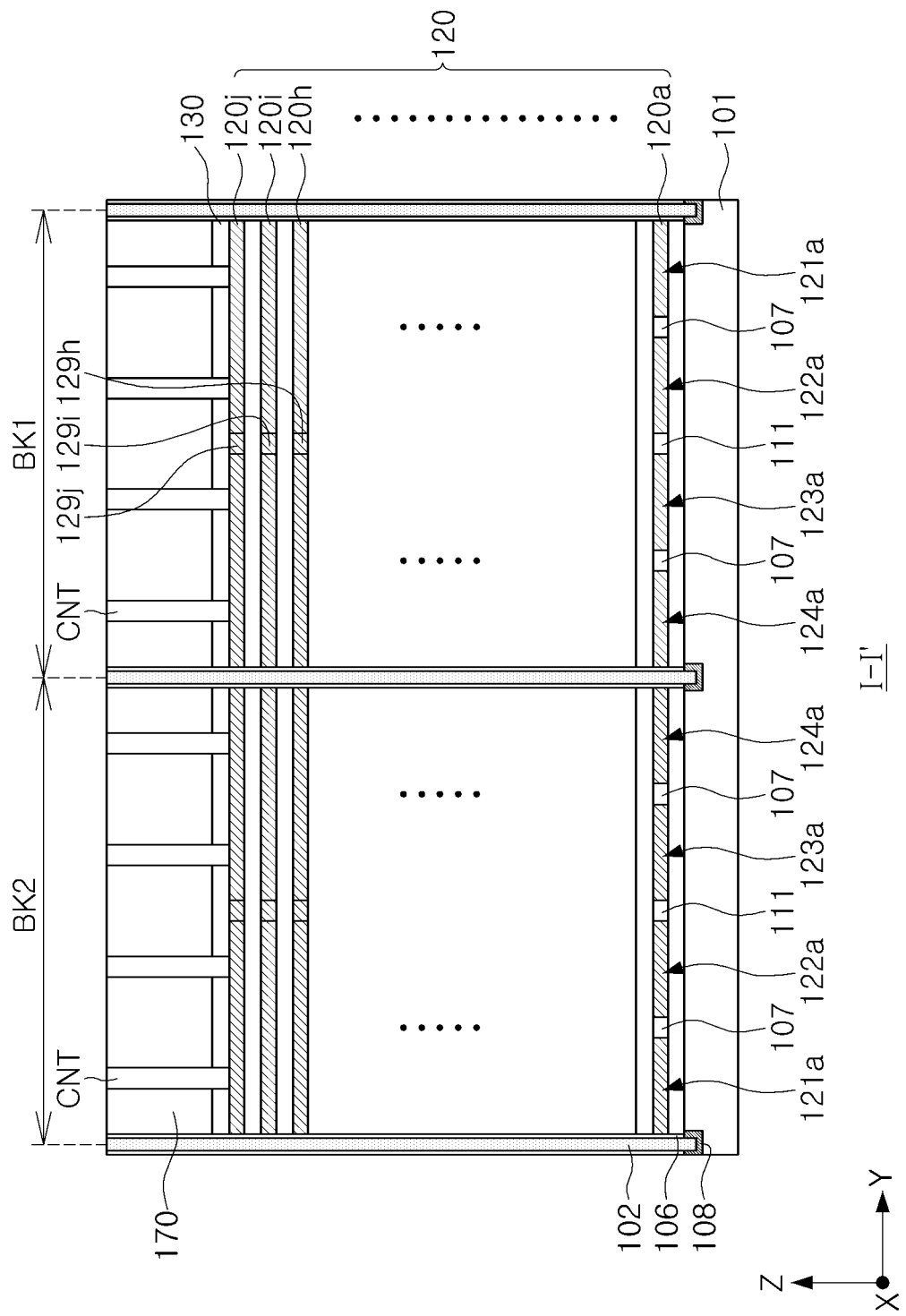
FIG. 5 illustrates a cross-sectional view taken along line I-I' of the memory device illustrated in FIG. 3.

FIG. 5 illustrates a cross-sectional view taken along line I-I' of the memory device illustrated in FIG. 3.

With reference to FIG. 5, a memory device 100, according to an embodiment of the inventive concept, includes a substrate 101, a plurality of gate electrode layers 120 (i.e., 120a-120j), a plurality of mold insulating layers 130, and an interlayer insulating layer 170, disposed on the substrate 101. A gate electrode layer 120k (and any additional gate electrode layer subsequent gate electrode layer 120k) functioning as an SSL are not illustrated in the cross-sectional view shown in FIG. 5. The memory device 100 includes contact plugs CNT connected to gate electrode layer 120j.

The plurality of gate electrode layers 120 include the interlayer insulating layer 170 disposed thereon. The interlayer insulating layer 170 may include an insulating material, such as for example a silicon oxide, a silicon nitride, or the like. For example, the interlayer insulating layer 170 may be formed using a high density plasma (HDP) oxide film or a tetraethyl orthosilicate (TEOS) oxide film.

The plurality of gate electrode layers 120, the plurality of mold insulating layers 130, and the interlayer insulating layer 170 are divided into a plurality of blocks BK1 and BK2 by a plurality of common source lines 102 extending in a first direction (X direction).

In the meantime, in respective blocks BK1 and BK2 divided by pairs of common source lines 102, a gate electrode layer 120a disposed in a lowermost portion of gate electrode layers 120, functioning as GSLs, is divided by first separation insulating patterns 107 and second separation insulating pattern 111. Respective gate electrode layers 120b to 120j are divided into two unit electrodes. In the respective blocks BK1 and BK2, the two unit electrodes of respective gate electrode layers 120b to 120j function as two WLs. The two unit electrodes disposed on the same level of respective gate electrode layers 120b to 120j are connected by respective connection electrodes. For the sake of convenience, only gate electrode layers 120h, 120i, and 120j among gate electrode layers 120b-120j, and connection electrodes 129h, 129i, and 129j connecting unit electrodes of respective gate electrode layers 120h, 120i, and 120j, are shown in FIG. 5. The second separation insulating patterns 111 are disposed below the connection electrodes 129h, 129i, and 129j. The second separation insulating patterns 111 may be disposed to overlap the connection electrodes 129h, 129i, and 129j on an X-Y plane. In the respective blocks BK1 and BK2, the gate electrode layer 120a disposed in the lowermost portion of the gate electrode layers 120 is divided into four unit electrodes 121a, 122a, 123a, and 124a. In other words, four GSLs may be disposed on the same level in the respective blocks BK1 and BK2. Respective WLs provided by respective gate electrode layers 120b to 120j may overlap two GSLs.

The second separation insulating patterns 111 are respectively disposed between the first separation insulating patterns 107. The first separation insulating patterns 107 are respectively disposed between a first unit electrode 121a and a second unit electrode 122a, and between a third unit electrode 123a and a fourth unit electrode 124a. In addition, the second separation insulating patterns 111 are respectively disposed between the second unit electrodes 122a and the third unit electrodes 123a. The first separation insulating patterns 107 and the second separation insulating patterns 111 may be simultaneously formed, and may be formed using an insulating material. In some embodiments, the first separation insulating patterns 107 and the second separation insulating patterns 111 may include an insulating material different from that of the mold insulating layers 130. For example, the first separation insulating patterns 107 and the second separation insulating patterns 111 may be provided as a silicon nitride including an impurity, such as hydrogen (H), or the like. In addition, the mold insulating layers 130 may be provided as a silicon oxide. In some embodiments, the first separation insulating patterns 107 and the second separation insulating patterns 111 may include an insulating material that is the same as that of the mold insulating layers 130. For example, the first separation insulating patterns 107, the second separation insulating patterns 111, and the mold insulating layers 130 may be provided as a silicon oxide.

The common source lines 102 are connected to a source region 108 of the substrate 101. The source region 108 may be formed in such a manner that an impurity having a specific conductivity type is injected into the substrate 101. For example, the source region 108 may be provided as a region doped with an n-type impurity. The source region 108 may extend in the first direction (X direction in FIG. 5) in a manner the same as the common source lines 102. An insulating layer 106 may be disposed between the common source lines 102 and the plurality of gate electrode layers 120.

Figure 6:
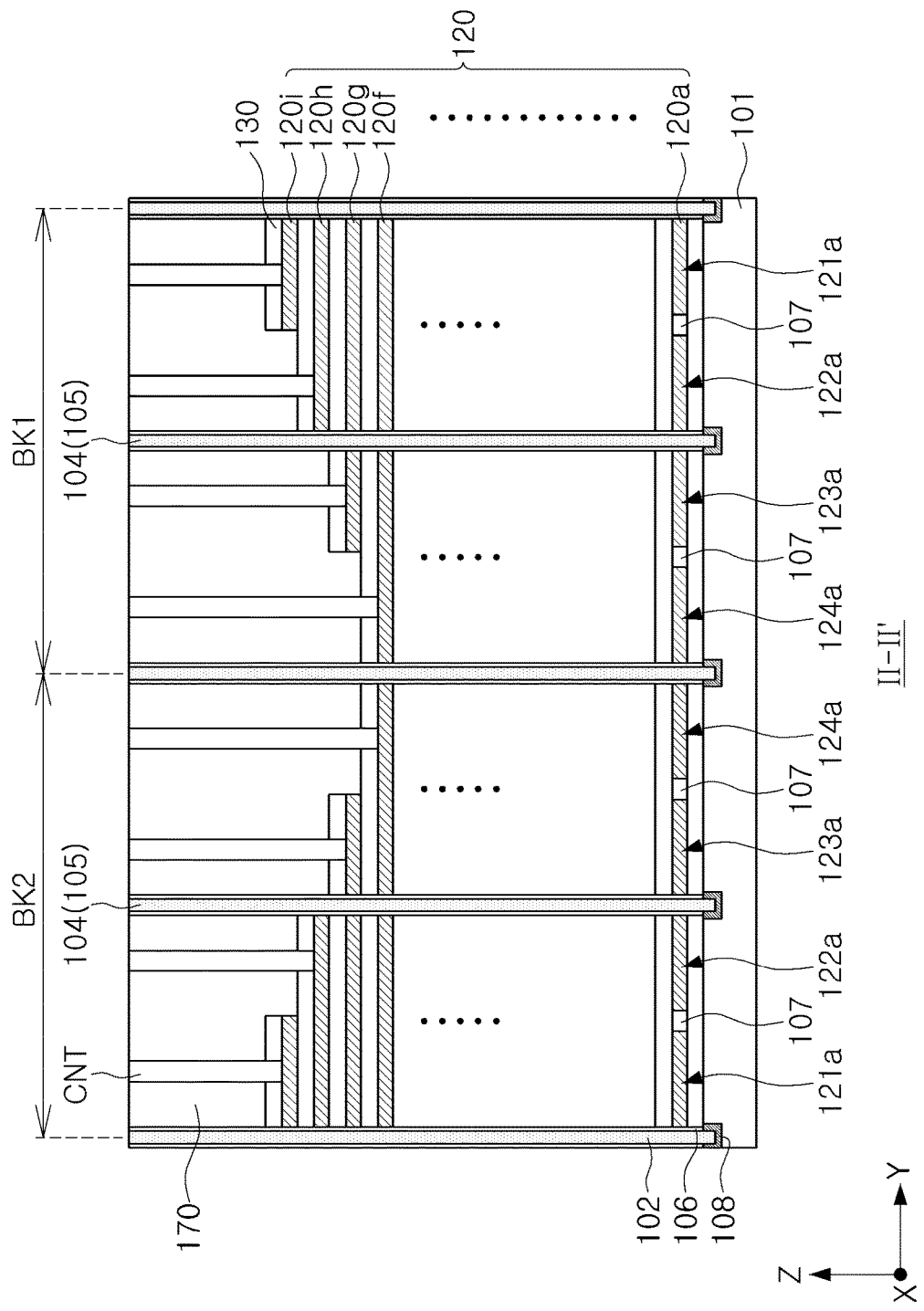
FIG. 6 illustrates a cross-sectional view taken along line II-II' of the memory device illustrated in FIG. 3.

FIG. 6 illustrates a cross-sectional view taken along line II-II' of the memory device illustrated in FIG. 3. For the sake of brevity, detailed description of features in FIG. 6 that are the same or similar (or have the same reference numerals) as features in FIG. 5 may be omitted from the following.

With reference to FIG. 6, a memory device 100 according to an embodiment of the inventive concept, includes gate electrode layers 120f, 120g, 120h, and 120i, having a stepped structure in a second direction (Y direction in FIG. 6), and includes contact plugs CNT connected to the gate electrode layers 120f, 120g, 120h, and 120i. First conductive lines 105 are disposed adjacent gate electrode layers 120, but are electrically isolated from gate electrode layers 120 by insulating layers 106.

In respective blocks BK1 and BK2 divided by pairs of common source lines 102, a plurality of gate electrode layers 120 are divided into unit electrodes by the first conductive lines 105 extending in a first direction (X direction). Respective gate electrode layers 120 are divided into two unit electrodes disposed on the same level. In the respective blocks BK1 and BK2, two unit electrodes of respective gate electrode layers 120b to 120i function as two WLs. FIG. 6 illustrates only second portions 104 of the first conductive lines 105.

In the respective blocks BK1 and BK2, agate electrode layer 120a disposed in a lowermost portion of gate electrode layers 120 is divided into four unit electrodes 121a, 122a, 123a, and 124a. In other words, four GSLs may be disposed on the same level in the respective blocks BK1 and BK2. Respective WLs provided by respective gate electrode layers 120b to 120i may overlap two GSLs.

The first conductive lines 105 are disposed between first separation insulating patterns 107. The first separation insulating patterns 107 are respectively disposed between a first unit electrode 121a and a second unit electrode unit 122a, and between a third unit electrode 123a and a fourth unit electrode 124a. In addition, first conductive lines 105 are respectively disposed between the second unit electrode 122a and the third unit electrode 123a.

The first conductive lines 105 and the common source lines 102 may be simultaneously formed. The first conductive lines 105 are connected to source regions 108 of a substrate 101. The insulating layer 106 is disposed between the first conductive lines 105 and the plurality of gate electrode layers 120.

Figure 7:
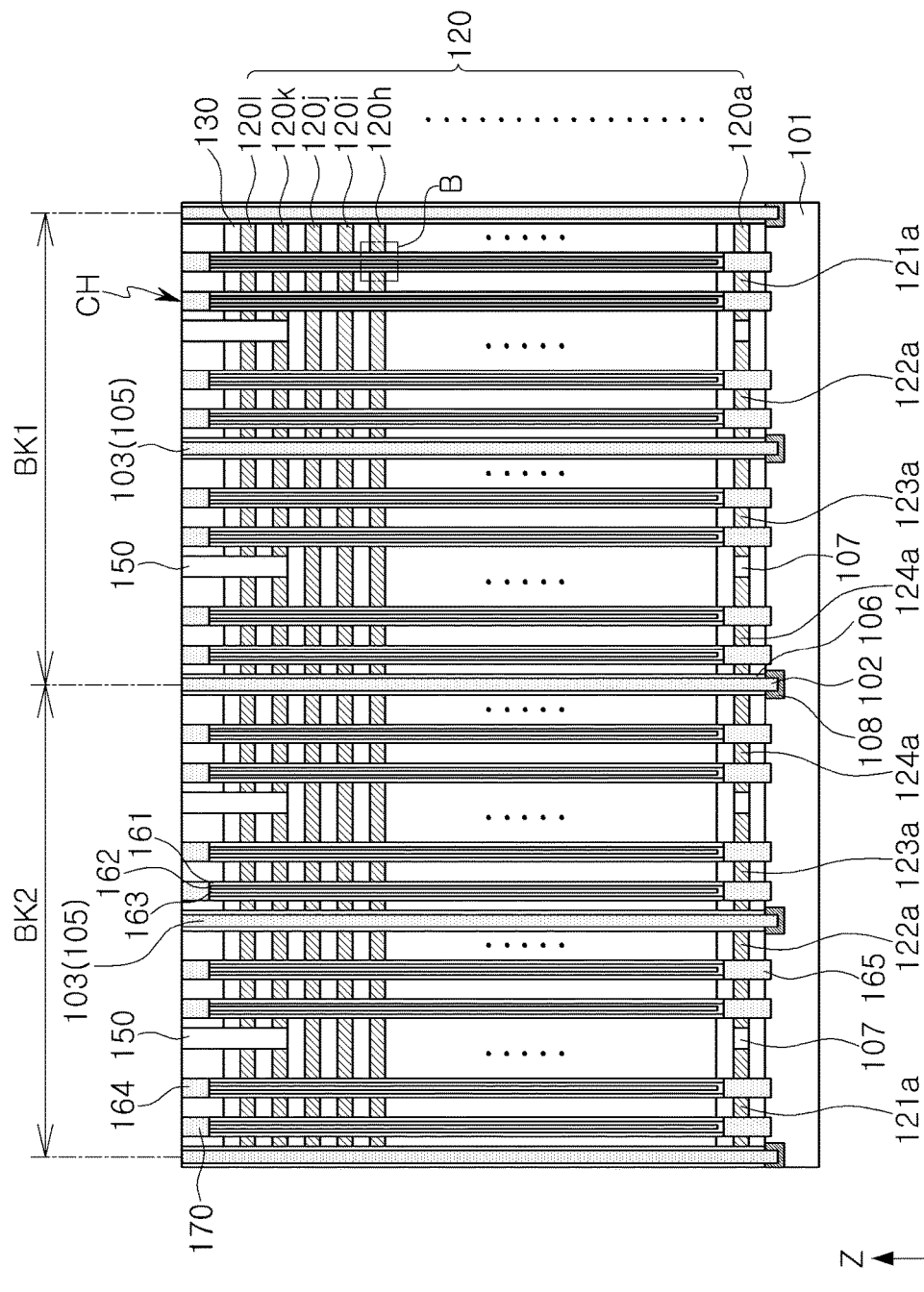
FIG. 7 illustrates a cross-sectional view taken along line III-III' of the memory device illustrated in FIG. 3.

FIG. 7 illustrates a cross-sectional view taken along line III-III' of the memory device illustrated in FIG. 3. For the sake of brevity, detailed description of features in FIG. 7 that are the same or similar (or have the same reference numerals) as features in FIGS. 5 and 6 may be omitted from the following.

With reference to FIG. 7, a memory device 100 according to an embodiment of the inventive concept includes fourth separation insulating patterns 150 dividing gate electrode layers 120k and 120l functioning as SSLs and a plurality of cell channel structures CH.

In respective blocks BK1 and BK2 divided by pairs of common source lines 102, a plurality of gate electrode layers 120 are divided into unit electrodes by a first conductive lines 105 extended in a first direction (X direction). Respective gate electrode layers 120 are divided into two unit electrodes disposed on the same level. FIG. 7 illustrates only first portions 103 of the first conductive lines 105.

In the respective blocks BK1 and BK2, gate electrode layers 120k and 120l disposed in an upper portion of gate electrode layers 120 are divided into four unit electrodes by the first conductive lines 105 and the fourth separation insulating patterns 150. In other words, the respective blocks BK1 and BK2 may include four SSLs disposed therein. Respective WLs provided by respective gate electrode layers 120b to 120j may overlap two SSLs and two GSLs. SSLs and GSLs may have one-to-one correspondence vertically.

The first conductive lines 105 are disposed between the fourth separation insulating patterns 150. The fourth separation insulating patterns 150 are disposed to overlap the first separation insulating patterns 107 on an X-Y plane.

A plurality of cell channel structures CH penetrate through an interlayer insulating layer 170, a plurality of gate electrode layers 120 (e.g., gate electrode layers 120a to 120l), and the like, and extend to a substrate 101. Each of the plurality of cell channel structures CH include a gate insulating layer 161, a channel layer 162, an embedded insulating layer 163, a bit line pad 164, an epitaxial layer 165, among other features. Hereinafter, a cell channel structure CH will be described, with reference to FIG. 8. In the meantime, a dummy channel structure DCH (not shown) may have a structure similar to that of the cell channel structure CH.

Figure 8:
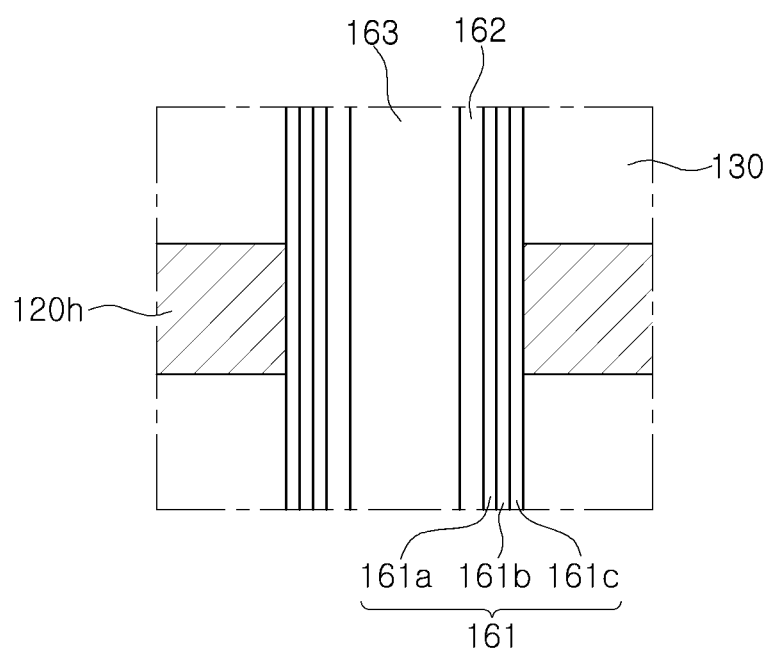
FIG. 8 illustrates an enlarged view of region "B" of a memory device illustrated in FIG. 7.

FIG. 8 illustrates an enlarged view of region "B" of the memory device illustrated in FIG. 7.

With reference to FIG. 8, the gate insulating layer 161 may include a tunneling layer 161a, a charge storage layer 161b, and a blocking layer 161c, layered on the channel layer 162 in sequence.

The channel layer 162 may include a semiconductor material, such as for example polysilicon, or the like. In an embodiment of the inventive concept illustrated in FIGS. 7 and 8, the channel layer 162 may have a pipe form having space therein. Alternatively, however, the channel layer 162 may also have a cylindrical form having no space therein. In this case, the embedded insulating layer 163 may be omitted. In the meantime, in FIGS. 7 and 8, an entirety of gate insulating layer 161 is illustrated as being formed to surround an external side surface of the channel layer 162, but the present inventive concept is not limited thereto.

In detail, the tunneling layer 161a may include for example a silicon nitride. In a memory device in the embodiment as described above, an electron may penetrate through the tunneling layer 161a and move to the charge storage layer 161b using the Fowler-Nordheim (F-N) mechanism. The charge storage layer 161b may be provided as a charge trapping layer or a floating gate conductive layer. In detail, the charge storage layer 161b may include a dielectric material, such as a silicon nitride, or the like, a quantum dot or a nanocrystal. In this case, the quantum dot or the nanocrystal may include a conductive material, such as fine particles of a metal or a semiconductor. The blocking layer 161c may for example include a silicon oxide ($SiO_2$), a silicon nitride ($Si_3N_4$), a silicon oxynitride (SiON), or a high-k dielectric material. The high-k dielectric material may for example be provided as one of an aluminum oxide ($Al_2O_3$), a tantalum oxide ($Ta_2O_3$), titanium dioxide ($TiO_2$), an yttrium oxide ($Y_2O_3$), zirconium dioxide ($ZrO_2$), a zirconium silicate ($ZrSi_xO_y$), a hafnium oxide ($HfO_2$), a hafnium silicate ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), and a praseodymium oxide ($Pr_2O_3$).

Figure 9:
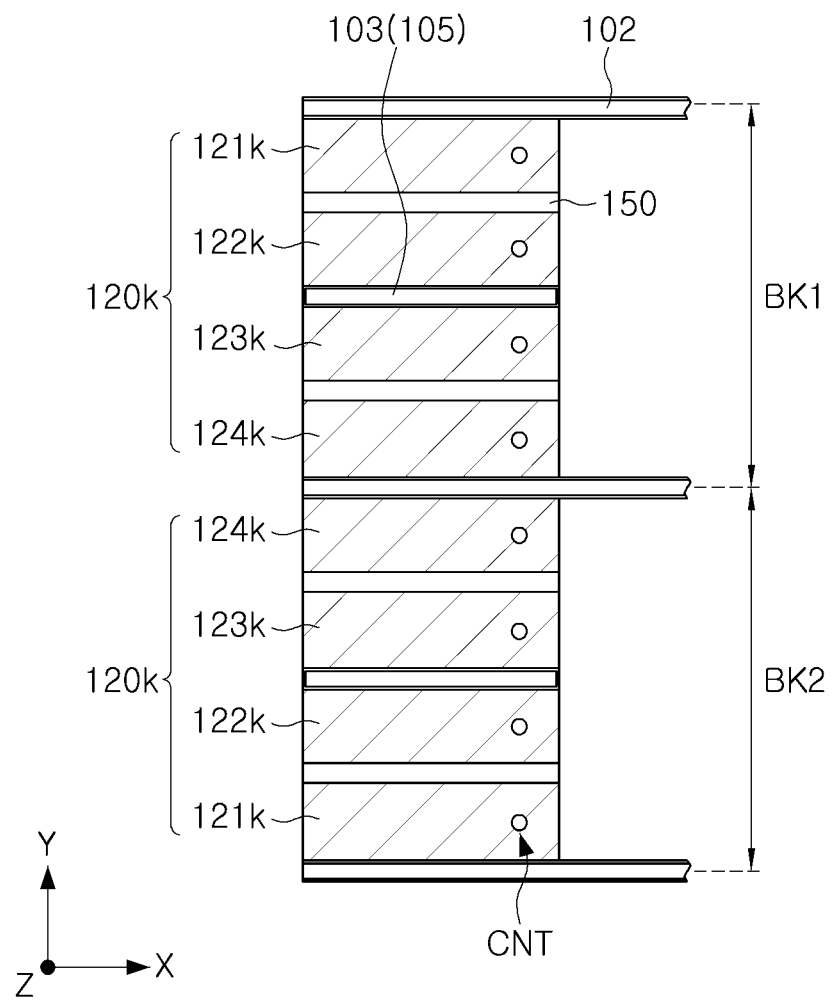
FIG. 9 illustrates a top view of gate electrode layers included in a memory device according to an embodiment of the inventive concept.

FIG. 9 illustrates a top view of a portion of a gate electrode layer included in a memory device according to an embodiment of the inventive concept. With reference to FIG. 9, in respective blocks BK1 and BK2 divided by a pair of common source lines 102, a gate electrode layer 120k includes four unit electrodes 121k to 124k disposed to be spaced apart from each other. Unit electrodes 121k to 124k are disposed to be spaced apart from each other by fourth separation insulating patterns 150 and first portions 103 of first conductive lines 105. A first unit electrode 121k and a second unit electrode 122k are disposed to be spaced apart from each other by a fourth separation insulating pattern 150, while a third unit electrode 123k and a fourth unit electrode 124k are disposed to be spaced apart from each other by a fourth separation insulating pattern 150. A second unit electrode 122k and a third unit electrode 123k are disposed to be spaced apart from each other by a first portion 103 of a first conductive line 105. The four unit electrodes 121k to 124k disposed to be spaced apart from each other function as four SSLs included in the respective blocks BK1 and BK2.

Figure 10:
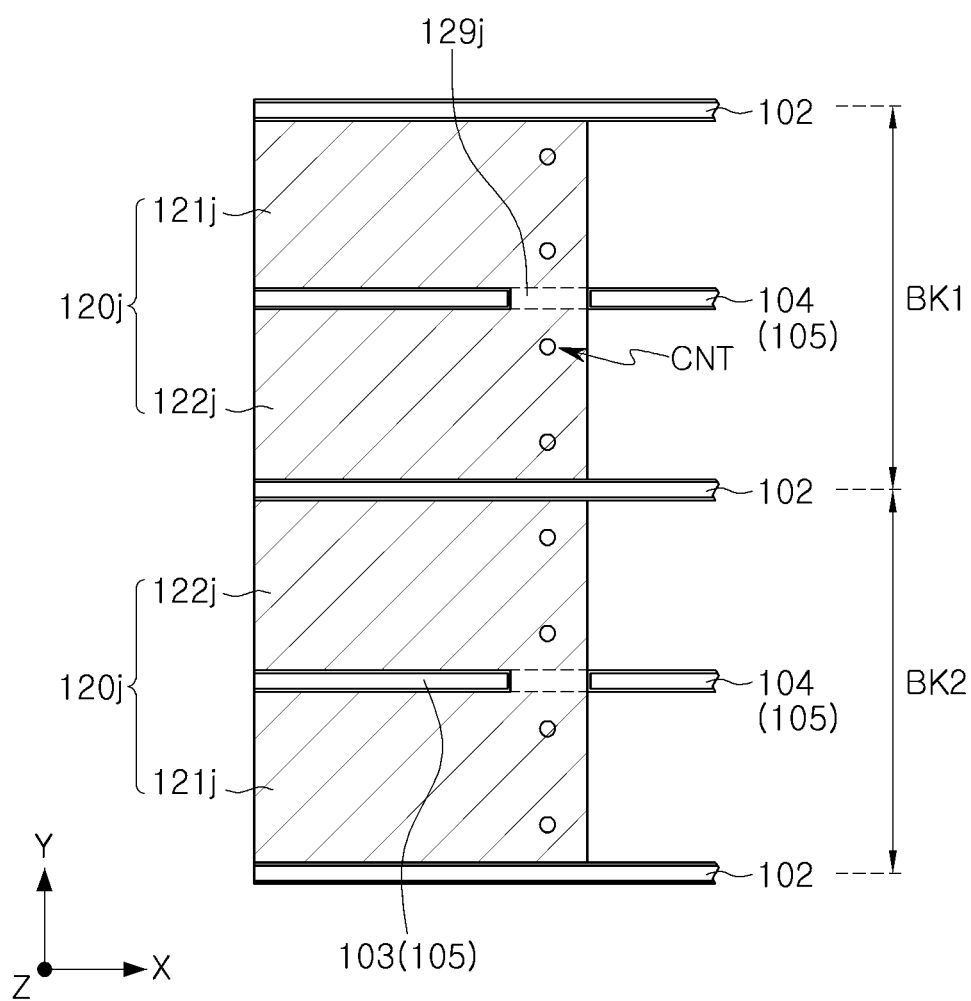
FIG. 10 illustrates a top view of gate electrode layers included in a memory device according to another embodiment of the inventive concept.

FIG. 10 illustrates a top view of a portion of another gate electrode layer included in a memory device according to an embodiment of the inventive concept. With reference to FIG. 10, in the respective blocks BK1 and BK2 divided by the pair of common source lines 102, a gate electrode layer 120j includes two unit electrodes 121j and 122j disposed to be spaced apart from each other. In a first block BK1 and a second block BK2, a gate electrode layer 120j is divided into the two unit electrodes 121j and 122j by a first conductive line 105. The two unit electrodes 121j and 122j function as two dummy word lines included in the respective blocks BK1 and BK2. In the respective blocks BK1 and BK2, the two unit electrodes 121j and 122j are connected by a connection electrode 129j. In the respective blocks BK1 and BK2, each of a gate electrode 121j and a gate electrode 122j include a pair of contact plugs CNT. In the respective blocks BK1 and BK2, the two dummy word lines provided by the gate electrode layer 120j are connected by the connection electrode 129j. The first conductive line 105 is shown as divided into a first portion 103 and a second portion 104 by the connection electrode 129j.

Figure 11:
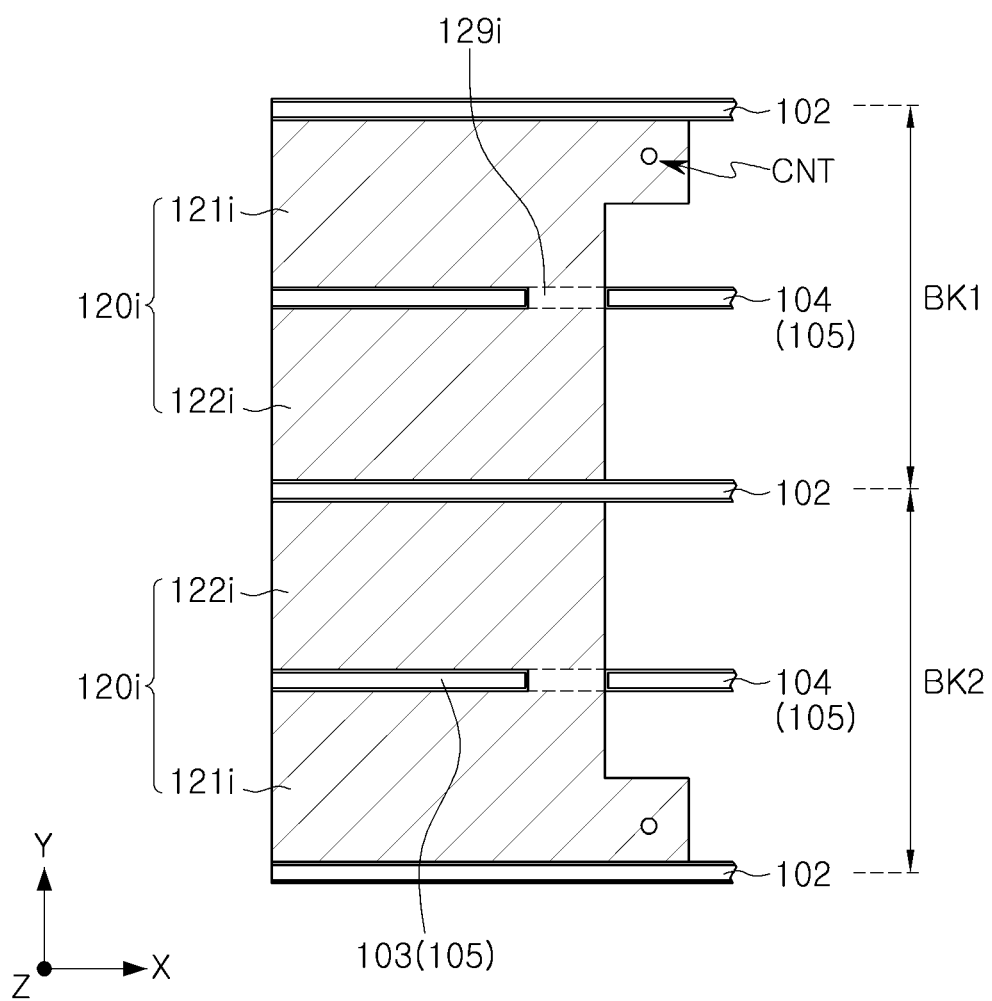
FIG. 11 illustrates a top view of gate electrode layers included in a memory device according to another embodiment of the inventive concept.

FIG. 11 illustrates a top view of a portion of another gate electrode layer included in a memory device according to an embodiment of the inventive concept. With reference to FIG. 11, in the respective blocks BK1 and BK2 divided by the pair of common source lines 102, a gate electrode layer 120i includes two unit electrodes 121i and 122i disposed to be spaced apart from each other. In the first block BK1 and the second block BK2, the gate electrode layer 120i is divided into the two unit electrodes 121i and 122i by a first conductive line 105. The two unit electrodes 121i and 122i function as two WLs included in the respective blocks BK1 and BK2. In the respective blocks BK1 and BK2, the two unit electrodes 121i and 122i are connected by a connection electrode 129i. In the respective blocks BK1 and BK2, the two WLs provided by the gate electrode layer 120i are connected by the connection electrode 129i. The first conductive line 105 is divided into a first portion 103 and a second portion 104 by the connection electrode 129i.

In the meantime, in the respective blocks BK1 and BK2, a first unit electrode 121i among the two unit electrodes 121i and 122i includes a protruding portion extended beyond a second unit electrode 122i in a first direction (X direction in FIG. 11). The protruding portion of the first unit electrode 121i connected to a contact plug CNT may be provided as a pad region.

A voltage supplied by the contact plug CNT connected to the first unit electrode 121i may be transmitted to an entirety of the first unit electrode 121i and the second unit electrode 122i.

Figure 12:
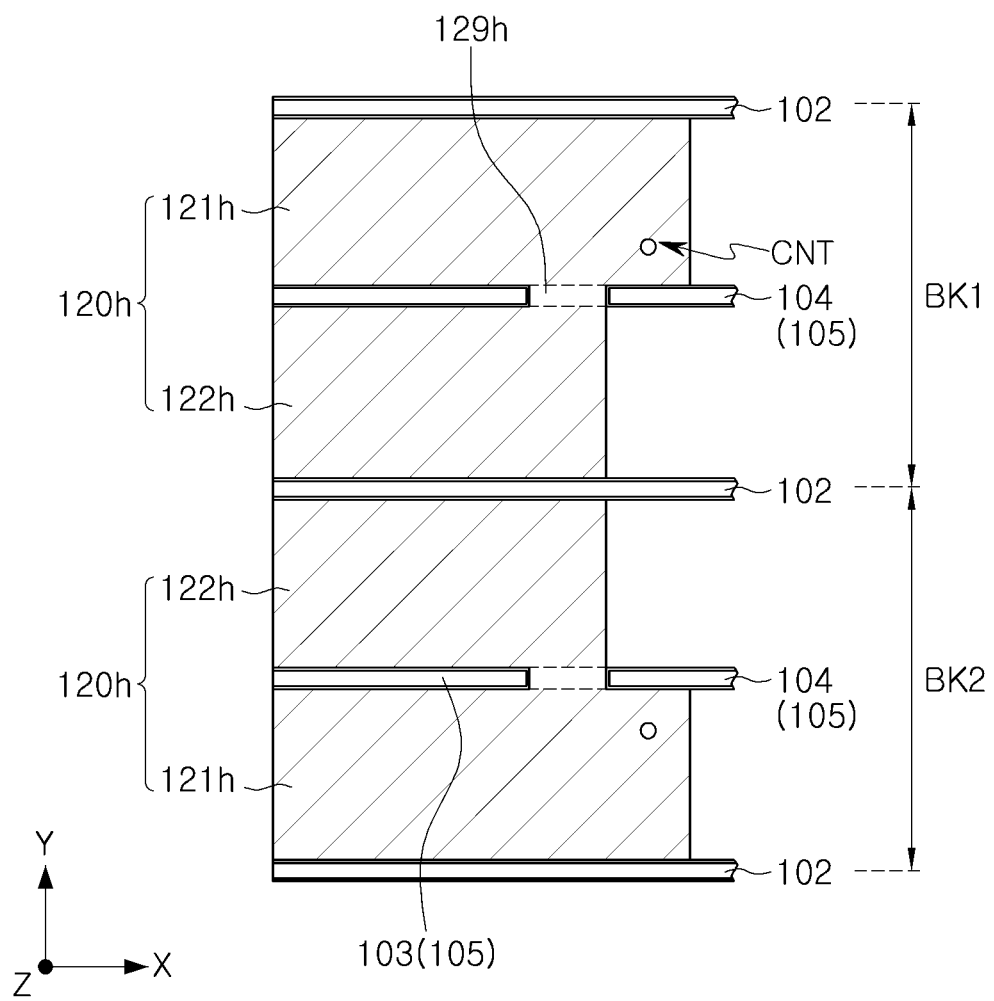
FIG. 12 illustrates a top view of gate electrode layers included in a memory device according to another embodiment of the inventive concept.

FIG. 12 illustrates a top view of a portion of another gate electrode layer included in a memory device according to an embodiment of the inventive concept. With reference to FIG. 12, in the respective blocks BK1 and BK2, a gate electrode layer 120h includes two unit electrodes 121h and 122h disposed to be spaced apart from each other. In the first block BK1 and the second block BK2, the gate electrode layer 120h is divided into the two unit electrodes 121h and 122h by a first conductive line 105. The two unit electrodes 121h and 122h function as two WLs included in the respective blocks BK1 and BK2. In the respective blocks BK1 and BK2, the two unit electrodes 121h and 122h are connected by a connection electrode 129h. In the respective blocks BK1 and BK2, the two WLs provided by the gate electrode layer 120h are connected by the connection electrode 129h. The first conductive line 105 is divided into a first portion 103 and a second portion 104 by the connection electrode 129h.

In the meantime, in the respective blocks BK1 and BK2, a first unit electrode 121h among unit electrodes 121h and 122h is extended beyond a second unit electrode 122h in the first direction (X direction in FIG. 12). A contact plug CNT is connected to a portion of a first unit electrode 121h of the gate electrode layer 120h, not overlapping the first unit electrode 121i of the gate electrode layer 120i. The portion of the first unit electrode 121h, connected to the contact plug CNT, may be provided as a pad region.

A voltage supplied by the contact plug CNT connected to the first unit electrode 121h may be transmitted to an entirety of the first unit electrode 121h and the second unit electrode 122h.

Figure 13:
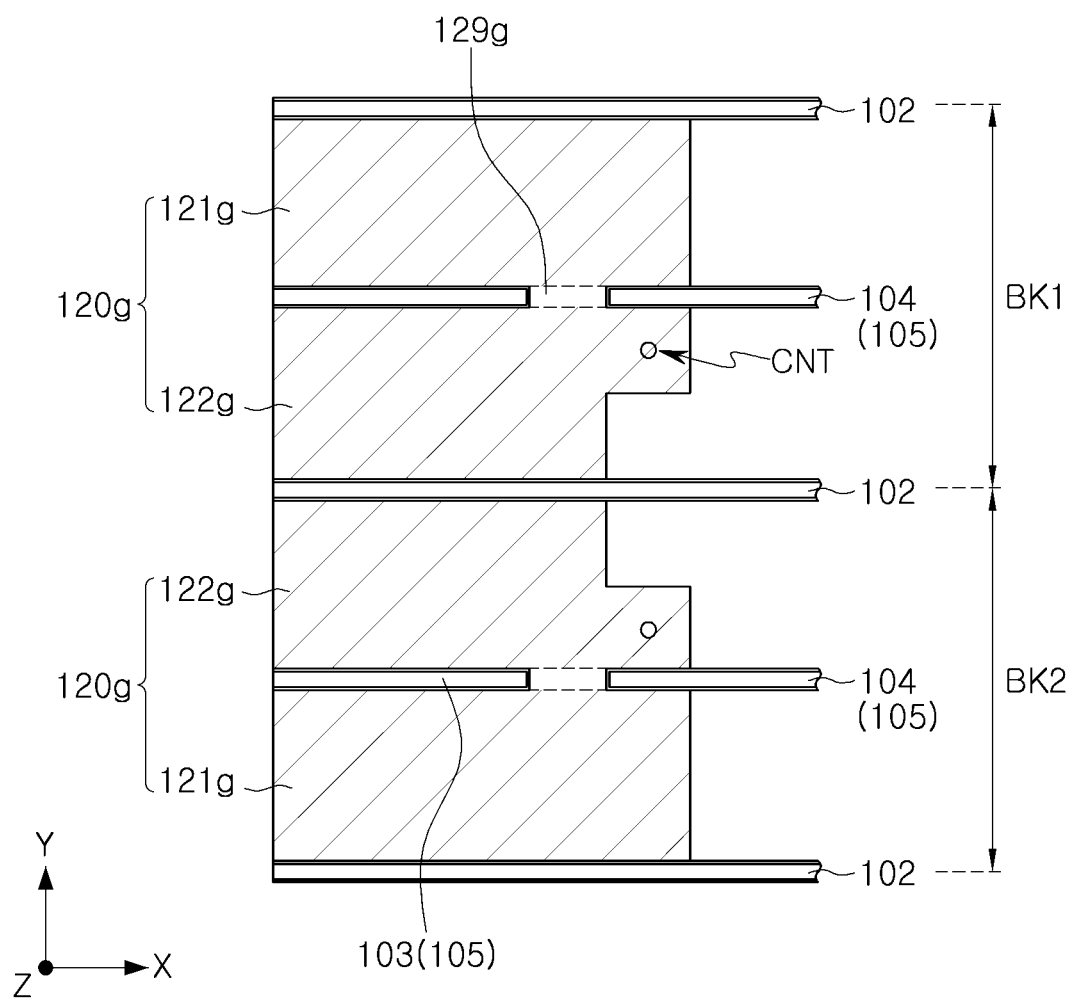
FIG. 13 illustrates a top view of gate electrode layers included in a memory device according to another embodiment of the inventive concept.

FIG. 13 illustrates a top view of a portion of another gate electrode layer included in a memory device according to an embodiment of the inventive concept. With reference to FIG. 13, in the respective blocks BK1 and BK2, a gate electrode layer 120g includes two unit electrodes 121g and 122g disposed to be spaced apart from each other. In the first block BK1 and the second block BK2, the gate electrode layer 120g is divided into the two unit electrodes 121g and 122g by a first conductive line 105. The two unit electrodes 121g and 122g function as two WLs included in the respective blocks BK1 and BK2. In the respective blocks BK1 and BK2, the two unit electrodes 121g and 122g are connected by a connection electrode 129g. In the respective blocks BK1 and BK2, the two WLs provided by the gate electrode layer 120g are connected by the connection electrode 129g. The first conductive line 105 is divided into a first portion 103 and a second portion 104 by a connection electrode 129g.

In the meantime, in the respective blocks BK1 and BK2, a second unit electrode 122g among unit electrodes 121g and 122g includes a protruding portion extended by an amount equal to that of a first unit electrode 121g in the first direction (X direction in FIG. 13). A contact plug CNT is connected to the protruding portion of the second unit electrode 122g of the gate electrode layer 120g, not overlapping the second unit electrode 122i of the gate electrode layer 120i. The protruding portion of the second unit electrode 122g, connected to the contact plug CNT, may be provided as a pad region.

A voltage supplied by the contact plug CNT connected to the second unit electrode 122g may be transmitted to an entirety of the first unit electrode 121g and the second unit electrode 122g.

Figure 14:
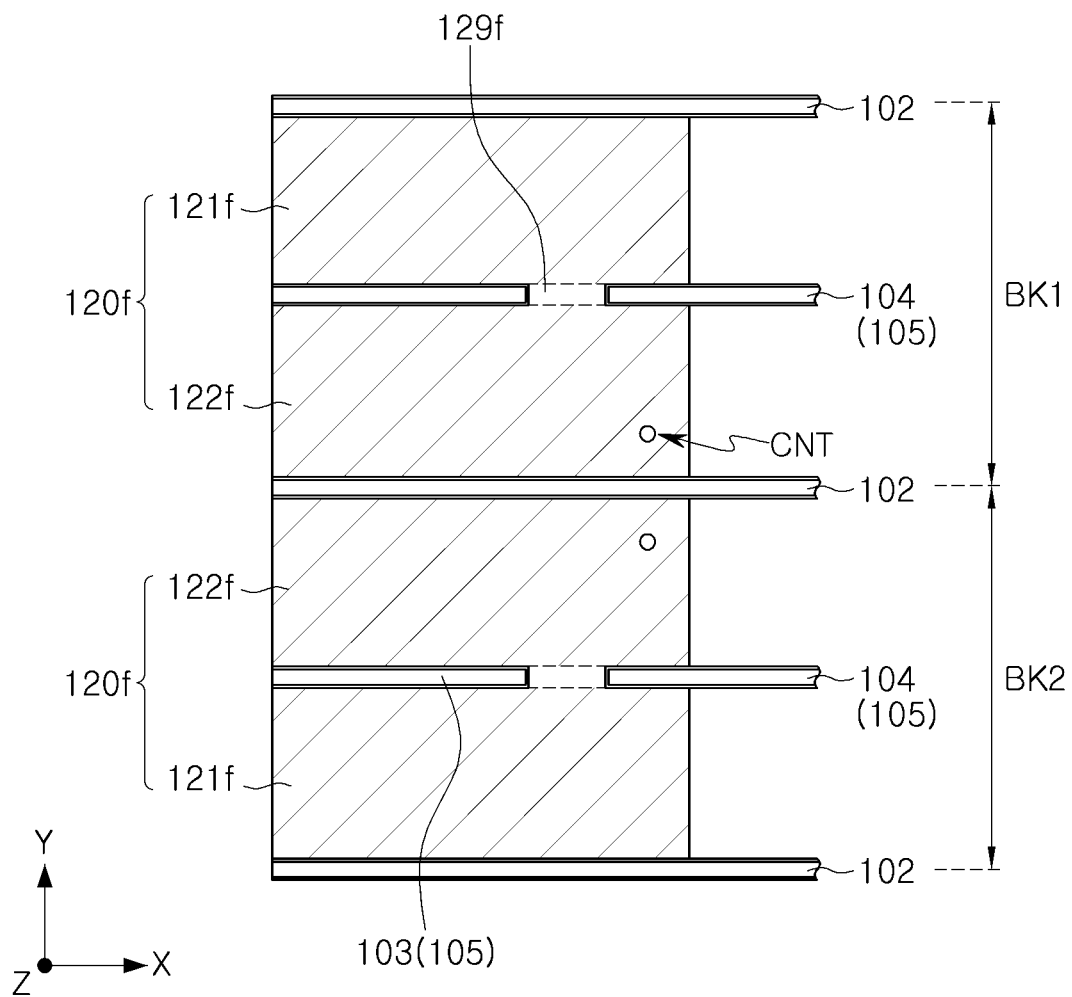
FIG. 14 illustrates a top view of gate electrode layers included in a memory device according to another embodiment of the inventive concept.

FIG. 14 illustrates a top view of a portion of another gate electrode layer included in a memory device according to an embodiment of the inventive concept. With reference to FIG. 14, in the respective blocks BK1 and BK2, a gate electrode layer 120f includes two unit electrodes 121f and 122f disposed to be spaced apart from each other. In the first block BK1 and the second block BK2, the gate electrode layer 120f is divided into the two unit electrodes 121f and 122f by a first conductive line 105. The two unit electrodes 121f and 122f function as two WLs included in the respective blocks BK1 and BK2. In the respective blocks BK1 and BK2, the two unit electrodes 121f and 122f are connected by a connection electrode 129f. In the respective blocks BK1 and BK2, the two WLs provided by the gate electrode layer 120f are connected by the connection electrode 129f. The first conductive line 105 is divided into a first portion 103 and a second portion 104 by a connection electrode 129f.

In the meantime, in the respective blocks BK1 and BK2, unit electrodes 121*f* and 122*f* are extended in the first direction (X direction in FIG. 14) by the same amount. A contact plug CNT is connected to a portion of a second unit electrode 122*f* of the gate electrode layer 120*f*, not overlapping the second unit electrodes 122*g* of the gate electrode layer 120*g*. The portion of a second unit electrode 122*f*, connected to the contact plug CNT, may be provided as a pad region.

A voltage supplied by the contact plug CNT connected to the second unit electrode 122*f* may be transmitted to an entirety of a first unit electrode 121*f* and the second unit electrode 122*f*.

Connection electrodes 129*f*, 129*g*, 129*h*, 129*i*, and 129*j* in FIGS. 10 to 14 may be disposed to overlap each other on an X-Y plane.

Figure 15:
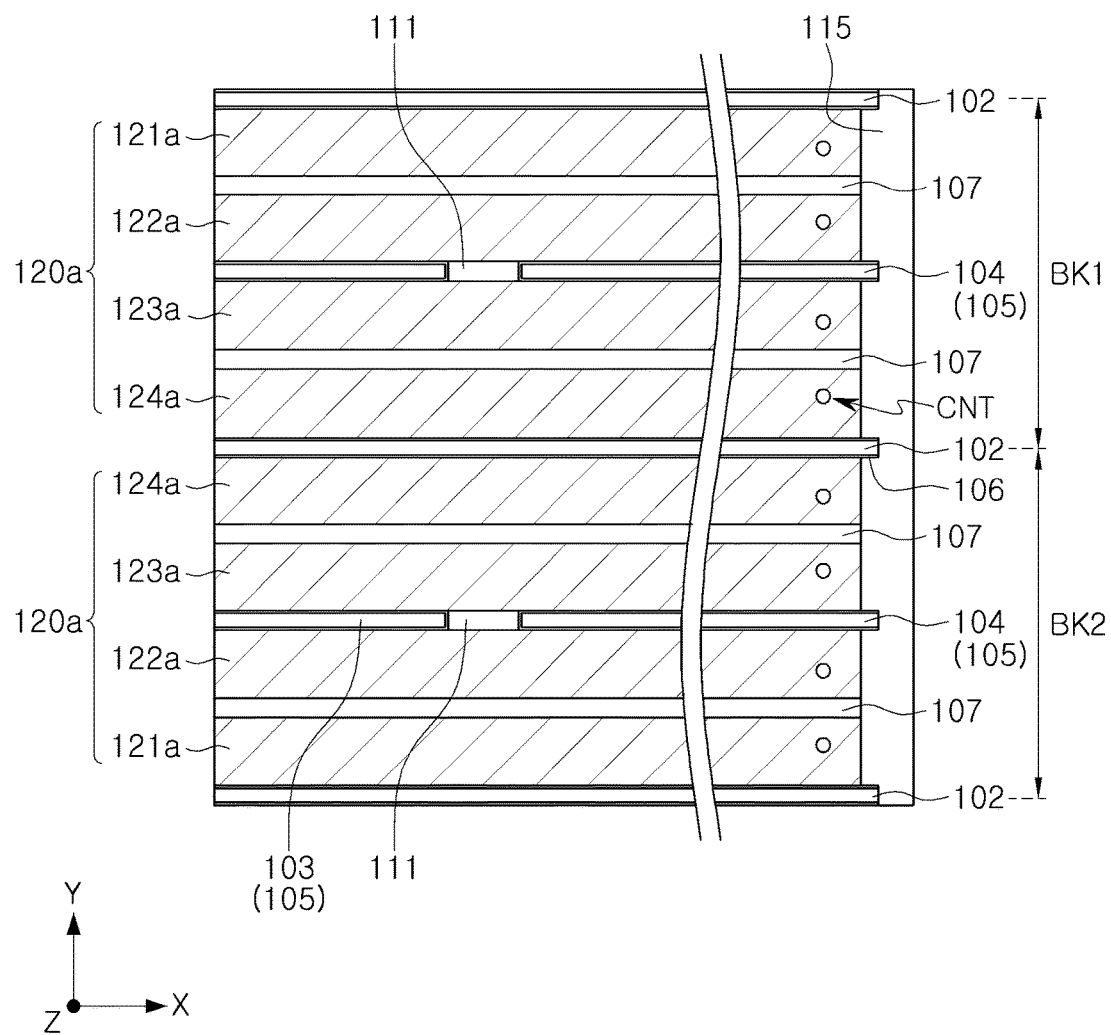
FIG. 15 illustrates a top view of gate electrode layers included in a memory device according to another embodiment of the inventive concept.

FIG. 15 illustrates a top view of a portion of another gate electrode layer included in a memory device according to an embodiment of the inventive concept. With reference to FIG. 15, in the respective blocks BK1 and BK2, a gate electrode layer 120*a* includes four unit electrodes 121*a*, 122*a*, 123*a*, and 124*a* disposed to be spaced apart from each other. In the first block BK1 and the second block BK2, a gate electrode layer 120*a* is divided into the four unit electrodes 121*a*, 122*a*, 123*a*, and 124*a* by first separation insulating patterns 107, a second separation insulating pattern 111, and a first conductive line 105. The four unit electrodes 121*a*, 122*a*, 123*a*, and 124*a* function as four GSLs included in the respective blocks BK1 and BK2. The first conductive line 105 may be divided into a first portion 103 and a second portion 104 by a second separation insulating pattern 111. The second separation insulating pattern 111 is disposed to overlap connection electrodes 129*f*, 129*g*, 129*h*, 129*i*, and 129*j* in FIGS. 10 to 14 on the X-Y plane. The first separation insulating patterns 107 are connected to the third separation insulating pattern 115 which is disposed to be in contact with an end portion of the gate electrode layer 120*a*.

In the meantime, in the respective blocks BK1 and BK2, unit electrodes 121*a*, 122*a*, 123*a*, and 124*a* are extended in the first direction (X direction in FIG. 15) the same amount.

Each of a first unit electrode 121*a*, a second unit electrode 122*a*, a third unit electrode 123*a*, and a fourth unit electrode 124*a* are connected to a contact plug CNT. In other words, in the respective blocks BK1 and BK2, a voltage may be supplied to each of the GSLs, separately.

The first separation insulating patterns 107, the second separation insulating patterns 111, and the third separation insulating pattern 115 may be simultaneously formed, and may be formed using an insulating material.

Figure 16:
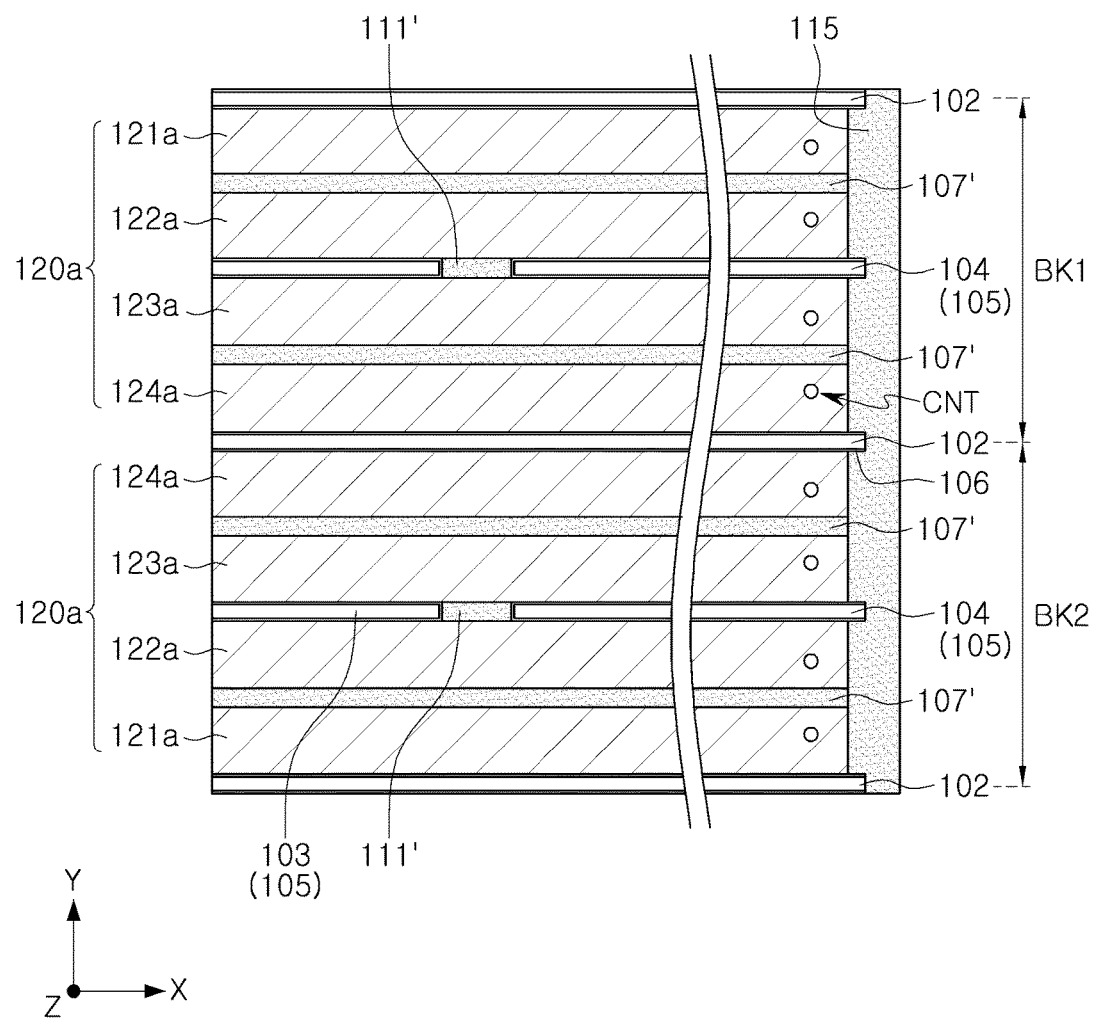
FIG. 16 illustrates a top view of gate electrode layers included in a memory device according to another embodiment of the inventive concept.

FIG. 16 illustrates a top view of a portion of a gate electrode layer included in a memory device according to an embodiment of the inventive concept. Hereinafter, a method of forming the first separation insulating patterns 107, the second separation insulating patterns 111, and the third separation insulating pattern 115 will be briefly described with reference to FIG. 16.

A process of forming the gate electrode layer 120 of a memory device, according to an embodiment of the inventive concept, may include a process of alternately stacking a plurality of mold insulating layers 130 and a plurality of sacrificial layers on a substrate 101, a process of removing portions of the plurality of sacrificial layers disposed between the plurality of mold insulating layers 130, and a process of filling a space from which the plurality of sacrificial layers are removed, with a conductive material. The plurality of sacrificial layers may include a material having a selective etching rate with respect to the plurality of mold insulating layers 130. For example, the plurality of sacrificial layers may be provided as a silicon nitride, while the plurality of mold insulating layers 130 may be provided as a silicon oxide. A sacrificial layer disposed in a lowermost portion of the plurality of sacrificial layers may be formed on the substrate 101. Subsequently, a portion of the sacrificial layer disposed in the lowermost portion of the plurality of sacrificial layers, corresponding to a region in which the first separation insulating patterns 107, the second separation insulating patterns 111, and the third separation insulating pattern 115 may be formed may be removed. A process of removing the portion of the sacrificial layer disposed in the lowermost portion of the plurality of sacrificial layers may include a process of forming a mask pattern including a first ground select line cut GC1, a second ground select line cut GC2, and a third ground select line cut GC3 in FIG. 2 and a wet etching process.

A region from which the portion of the sacrificial layer disposed in the lowermost portion of the plurality of sacrificial layers is removed may be filled with an insulating material, thus forming the first separation insulating patterns 107, the second separation insulating patterns 111, and the third separation insulating pattern 115. A process of filling the region from which the portion of the sacrificial layer disposed in the lowermost portion of the plurality of sacrificial layers is removed, with an insulating material, may include a deposition process and a polishing process. The insulating material may be formed using a material different from that of the plurality of mold insulating layers 130. For example, the insulating material may include a silicon oxycarbide (SiOC) or a fluorinated silicon oxide (SiOF).

Alternatively, in some embodiments, the region from which the portion of the sacrificial layer disposed in the lowermost portion of the plurality of sacrificial layers is removed may be filled in a process of forming the plurality of mold insulating layers 130. In this case, the first separation insulating patterns 107, the second separation insulating patterns 111, and the third separation insulating pattern 115 may be formed using a material the same as that of the plurality of mold insulating layers 130. In other words, the plurality of mold insulating layers 130, the first separation insulating patterns 107, the second separation insulating patterns 111, and the third separation insulating patterns 115 may be formed using one of a silicon oxide, SiOC, and SiOF.

In an embodiment of the inventive concept, through a process of forming a mask pattern including the first ground select line cut GC1 and the second ground select line cut GC2 in FIG. 2 and an ion implantation process, a first separation insulating pattern 107', a second separation insulating pattern 111', and a third separation insulating pattern 115' is formed as shown in FIG. 16.

An impurity, such as H, or the like, may be implanted into a portion of a sacrificial layer disposed in the lowermost portion of the plurality of sacrificial layers, corresponding to a region in which the first separation insulating patterns 107', the second separation insulating patterns 111', and the third separation insulating pattern 115' are formed, using the ion implantation process. In an embodiment, the plurality of sacrificial layers may be formed using a silicon nitride, while a silicon nitride including H as an impurity has an etching rate with respect to a phosphoric acid solution, lower than that of the silicon nitride. Therefore, a portion of the plurality of sacrificial layers including H as an impurity may not be etched, but may remain in a process of removing the plurality of sacrificial layers using the phosphoric acid solution, thus forming the first separation insulating patterns 107', the second separation insulating patterns 111', and the third separation insulating pattern 115'.

Figure 17:
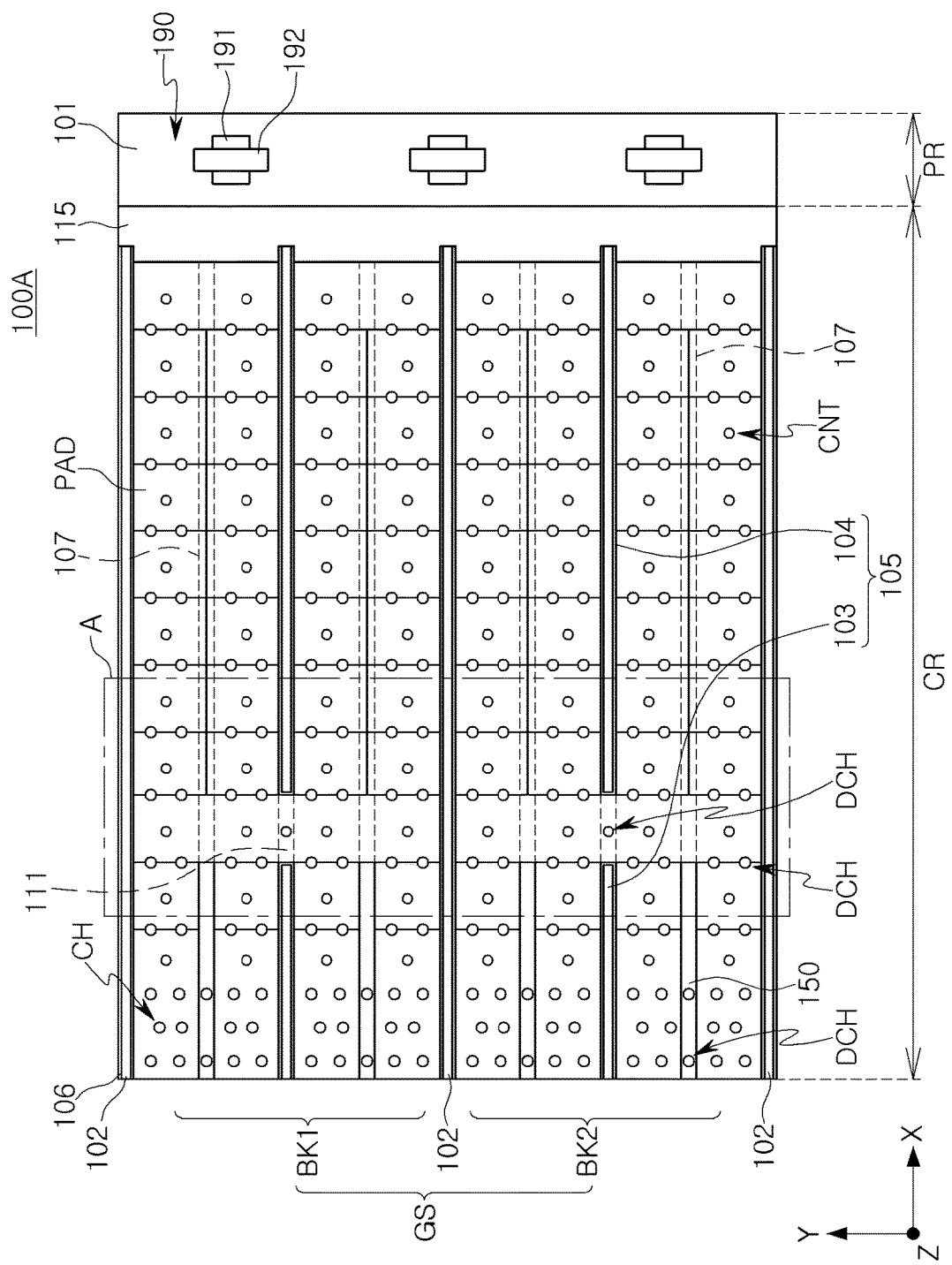
FIG. 17 illustrates a schematic top view of a memory device according to an embodiment of the inventive concept.
Figure 18:
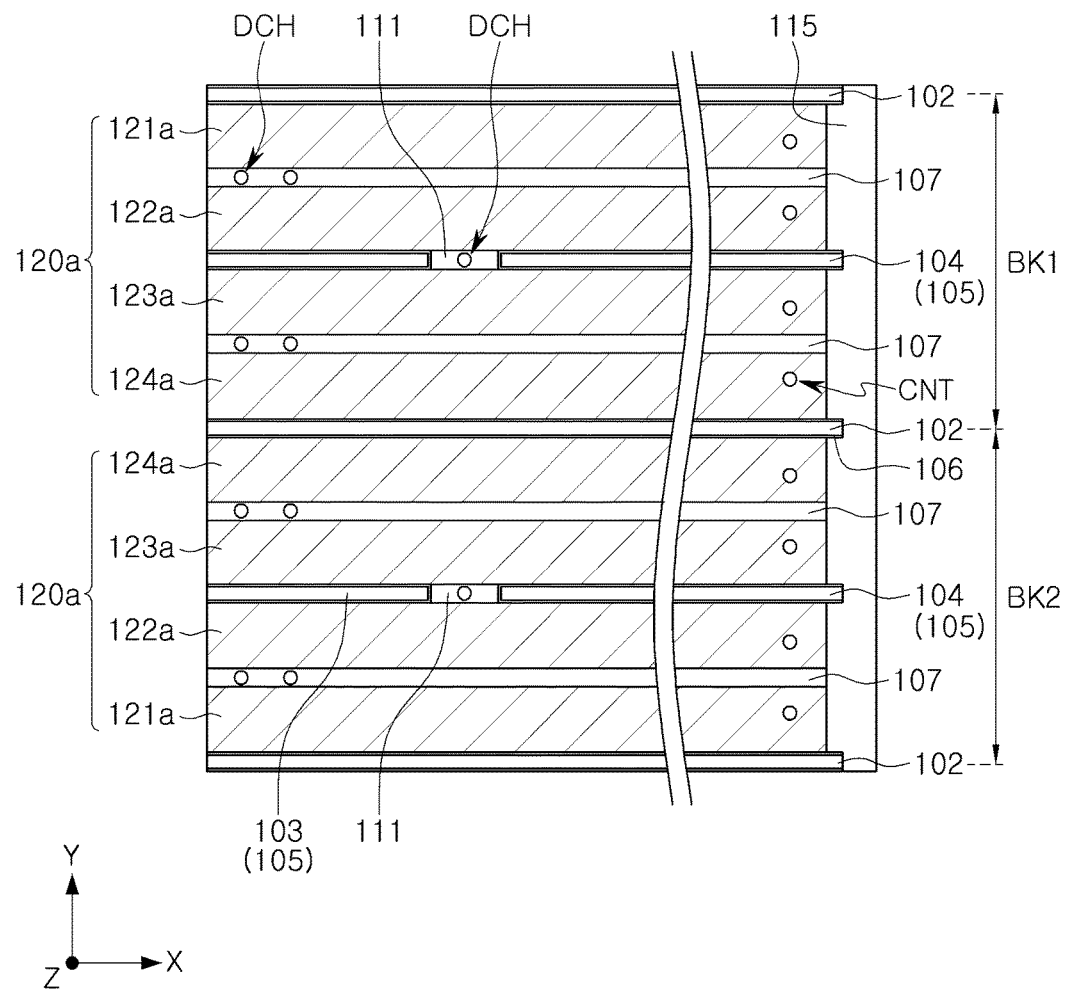
FIG. 18 illustrates a top view of a gate electrode layer included in a memory device according to an embodiment of the inventive concept.

FIG. 17 illustrates a schematic top view of a memory device according to an embodiment of the inventive concept. FIG. 18 illustrates a top view of a gate electrode layer included in a memory device according to an embodiment of the inventive concept. For the sake of brevity, detailed description of features in FIGS. 17 and 18 that are the same or similar (or have the same reference numerals) as features in FIGS. 3 and 15 may be omitted from the following.

A memory device 100A, illustrated in FIGS. 17 and 18, includes more dummy channel structures DCH disposed to overlap a first separation insulating pattern 107 and a second separation insulating pattern 111, than a memory device 100 illustrated in FIGS. 3 and 15. An arrangement of the dummy channel structure DCH is not limited to that illustrated in FIGS. 17 and 18, but may vary. A dummy channel structure DCH overlapping a first separation insulating pattern 107 may overlap a fourth separation insulating pattern 150. The dummy channel structure DCH may be applied to embodiments which will subsequently be described.

Figure 19:
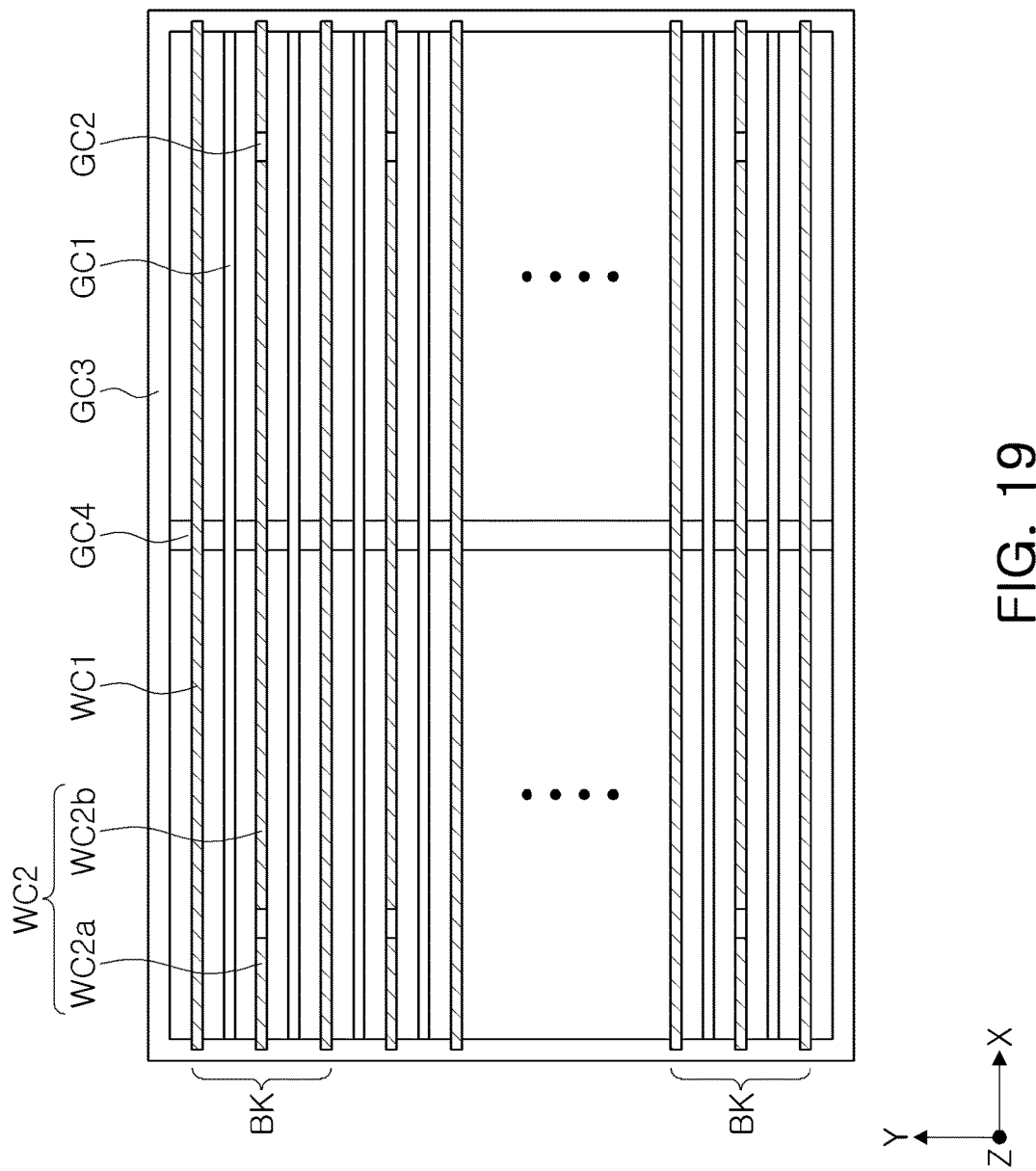
FIG. 19 illustrates a view of a layout of a memory device according to an embodiment of the inventive concept.

FIG. 19 is a view of a layout of a memory device according to an embodiment of the inventive concept. As compared to FIG. 2, a view of a layout of a memory device 100B illustrated in FIG. 19 additionally includes a fourth ground select line cut GC4 extended in a second direction (Y direction in FIG. 19), in a central region of a cell region. Therefore, in this embodiment, respective GSLs extended in a first direction (X direction in FIG. 19) are divided into two portions. The plurality of GSLs may be disposed to be spaced apart from each other in a second direction perpendicular to the first direction, and each of the divided portions of the plurality of GSLs may be disposed to be spaced apart from another corresponding divided portion of the plurality of GSLs in the first direction. In this embodiment, eight GSLs disposed to be spaced apart from each other are provided in each block BK.

FIGS. 20-29 illustrate layouts of memory devices of the inventive concept, and top views of gate electrode layers included in the memory devices. Detailed description of features in FIGS. 20-29 that are the same or similar (or have the same reference numerals) as features described with respect to previous figures may be omitted from the following.

Figure 20:
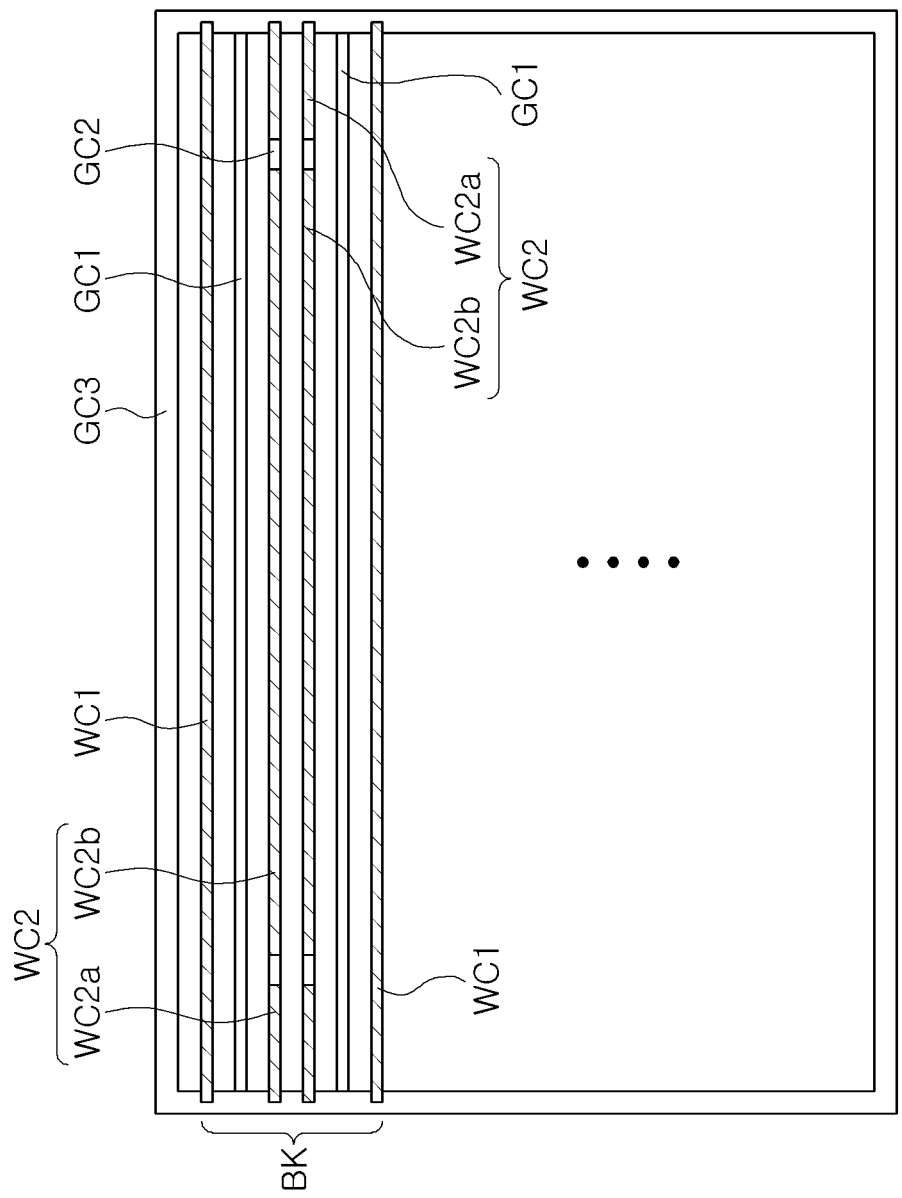
FIG. 20 illustrates a view of a layout of a memory device according to another embodiment of the inventive concept.
Figure 21:
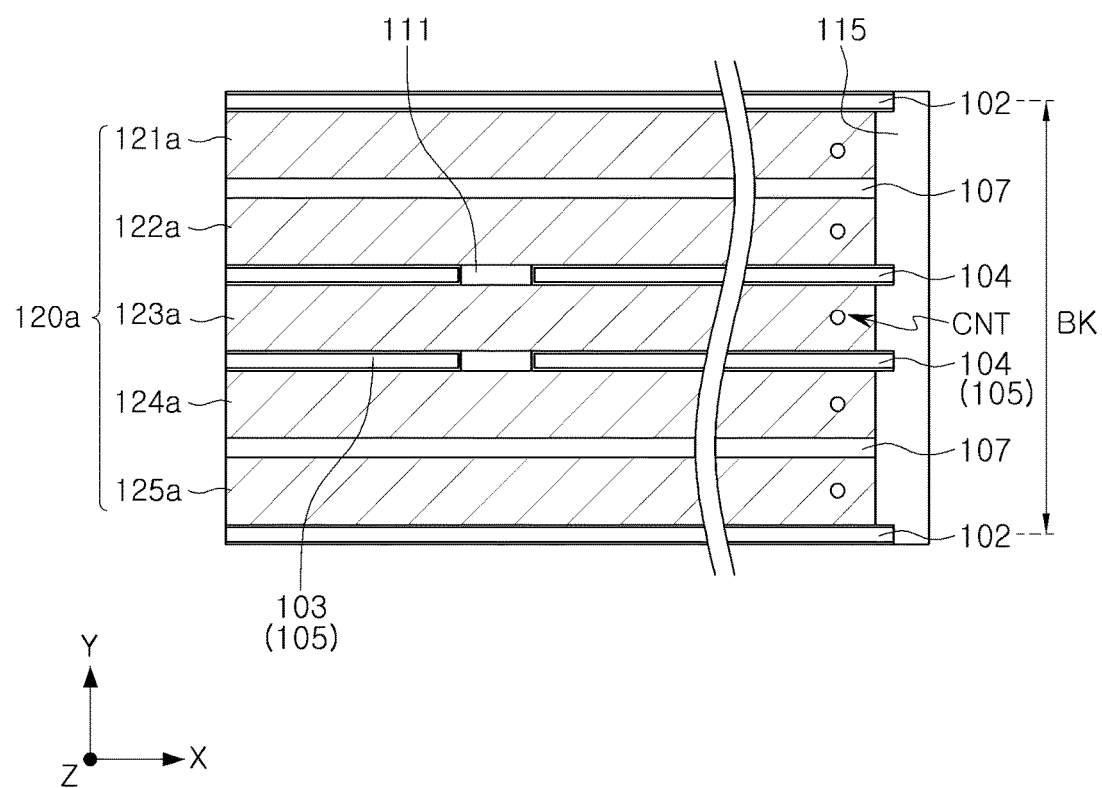
FIG. 21 illustrates a top view of a gate electrode layer included in the memory device of FIG. 20.

FIG. 20 illustrates a view of a layout of a memory device according to another embodiment of the inventive concept. FIG. 21 illustrates a top view of a gate electrode layer included in the memory device of FIG. 20.

With reference to FIG. 20, a single cell region includes a plurality of blocks BK. A single block BK is defined by a pair of first word line cuts WC1. Two first ground select line cuts GC1 are disposed in a single block BK, while two second word line cuts WC2 (each including portions WC2a and WC2b) are disposed between the two first ground select line cuts GC1.

With reference to FIG. 21, in each block BK defined by a pair of common source lines 102, a gate electrode layer 120a is divided into five unit electrodes 121a, 122a, 123a, 124a, and 125a by first separation insulating patterns 107, second separation insulating patterns 111, and first conductive lines 105. The five unit electrodes 121a, 122a, 123a, 124a, and 125a function as five GSLs included in each block BK. Each of a first unit electrode 121a, a second unit electrode 122a, a third unit electrode 123a, a fourth unit electrode 124a, and a fifth unit electrode 125a are connected to contact plugs CNT. In other words, in each block BK, a voltage may be supplied to each of five GSLs, separately.

Since descriptions of the first conductive lines 105, the first separation insulating patterns 107, the second separation insulating patterns 111, and a third separation insulating pattern 115 are the same as provided with reference to FIG. 15, further description thereof will be omitted. In addition, different gate electrode layers 120f, 120g, 120h, 120i, and 120j (not shown) functioning as WLs as described in previous embodiments may be divided into three unit electrodes in each block BK. Three unit electrodes disposed on the same level may be connected by connection electrodes 120f, 120g, 120h, 120i, and 120j such as previously described.

Figure 22:
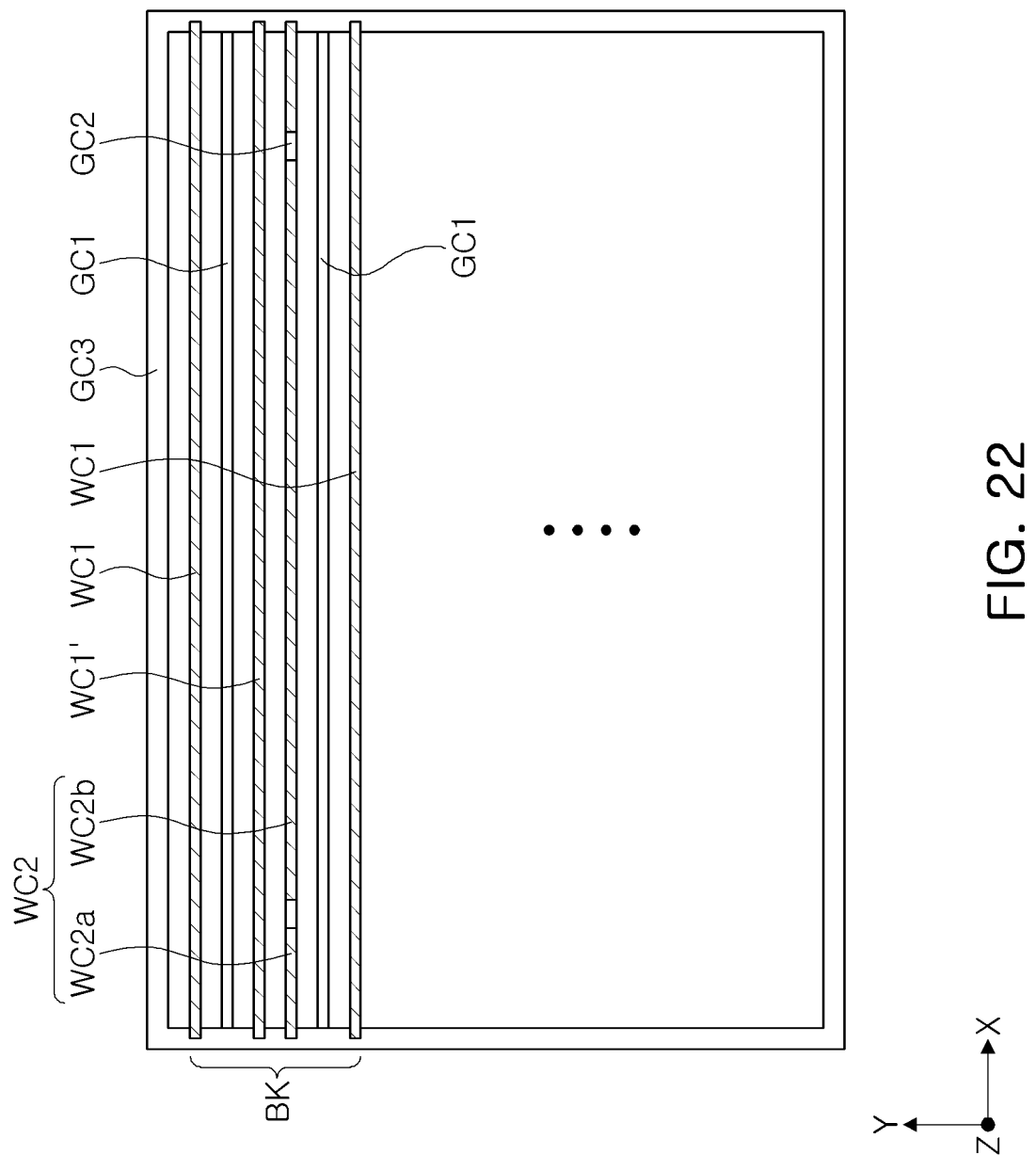
FIG. 22 illustrates a view of a layout of a memory device according to another embodiment of the inventive concept.
Figure 23:
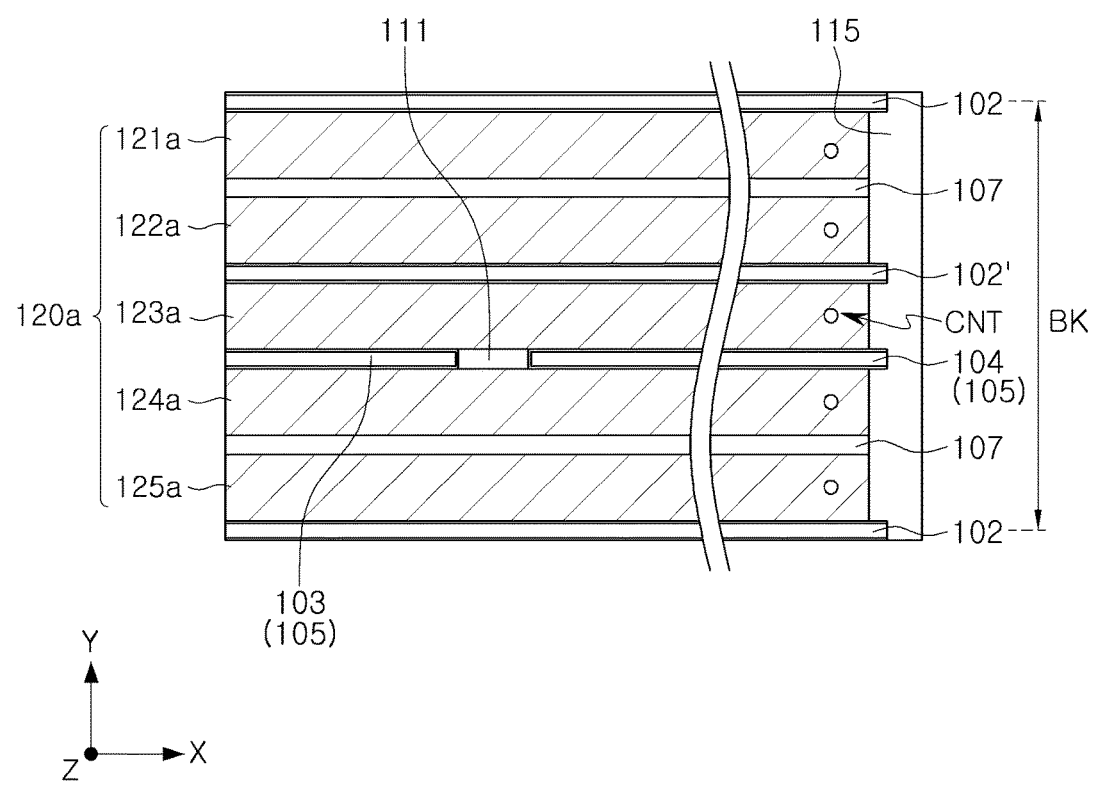
FIG. 23 illustrates a top view of a gate electrode layer included in the memory device of FIG. 22.

FIG. 22 illustrates a view of a layout of a memory device according to another embodiment of the inventive concept. FIG. 23 illustrates a top view of a gate electrode layer included in the memory device of FIG. 21.

With reference to FIG. 22, two first ground select line cuts GC1 are disposed in a single block BK, while a single second word line cut WC2 and a single third word line cut WC1' are disposed between the two first ground select line cuts GC1. The third word line cut WC1' may have a structure the same as that of a first word line cut WC1.

With reference to FIG. 23, in each block BK defined by a pair of common source lines 102, the gate electrode layer 120a is divided into five unit electrodes 121a, 122a, 123a, 124a, and 125a by the first separation insulating patterns 107, the second separation insulating pattern 111, the first conductive line 105, and a second conductive line 102'. The second conductive line 102' may have a structure the same as that of a common source line 102, and may be provided as a dummy source line. The five unit electrodes 121a, 122a, 123a, 124a, and 125a function as five GSLs included in each block BK. Each of the first unit electrode 121a, the second unit electrode 122a, the third unit electrode 123a, the fourth unit electrode 124a, and the fifth unit electrode 125a are connected to contact plugs CNT. In other words, in each block BK, a voltage may be supplied to each of the five GSLs, separately.

Since the descriptions of the first conductive line 105, the first separation insulating patterns 107, the second separation insulating pattern 111, and the third separation insulating pattern 115 are the same as provided with reference to FIG. 15, further descriptions thereof will be omitted. In addition, different gate electrode layers 120f, 120g, 120h, 120i, and 120j (not shown) functioning as the WLs as described in previous embodiments may be divided into three unit electrodes in each block BK. Two unit electrodes among three unit electrodes disposed on the same level may be connected by connection electrodes 120f, 120g, 120h, 120i, and 120j such as previously described.

Figure 24:
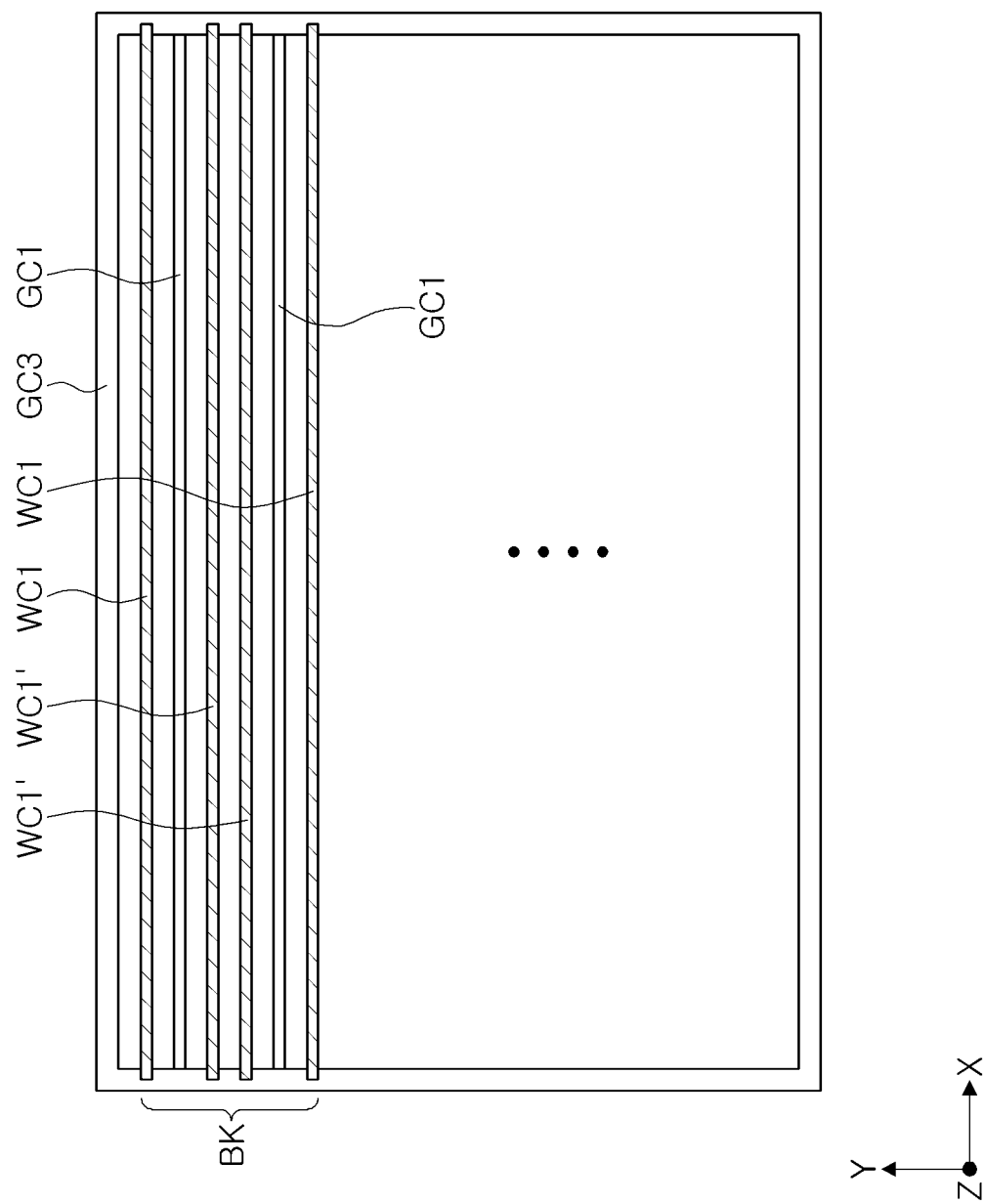
FIG. 24 illustrates a view of a layout of a memory device according to another embodiment of the inventive concept.
Figure 25:
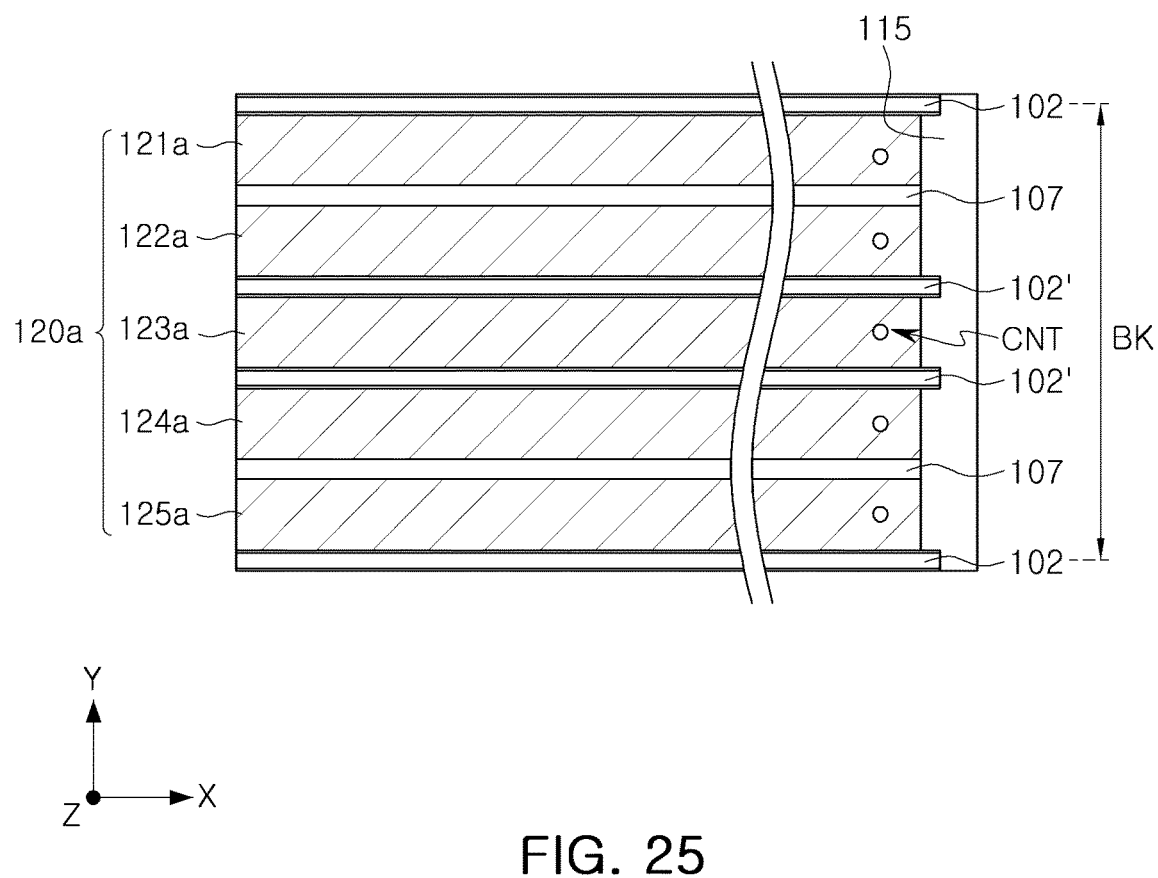
FIG. 25 illustrates a top view of a gate electrode layer included in the memory device of FIG. 24.

FIG. 24 illustrates a view of a layout of a memory device according to another embodiment of the inventive concept. FIG. 25 illustrates a top view of a gate electrode layer included in the memory device of FIG. 24.

With reference to FIG. 24, the two first ground select line cuts GC1 are disposed in the single block BK, while two third word line cuts WC1' are disposed between the two first ground select line cuts GC1.

With reference to FIG. 25, in each block BK defined by a pair of common source lines 102, the gate electrode layer 120a is divided into the five unit electrodes 121a, 122a, 123a, 124a, and 125a by the first separation insulating patterns 107 and the second conductive lines 102'. The second conductive lines 102' may have a structure the same as that of the common source line 102, and may be provided as a dummy source line. The five unit electrodes 121a, 122a, 123a, 124a, and 125a function as five GSLs included in each block BK. Each of the first unit electrode 121a, the second unit electrode 122a, the third unit electrode 123a, the fourth unit electrode 124a, and the fifth unit electrode 125a are connected to contact plugs CNT. In other words, in each block BK, a voltage may be supplied to each of the five GSLs, separately.

Since the descriptions of the first separation insulating patterns 107 and the third separation insulating pattern 115 are the same as the description provided with reference to FIG. 15, further descriptions thereof will be omitted. In addition, different gate electrode layers 120f, 120g, 120h, 120i, and 120j (not shown) functioning as the WLs as described in previous embodiments, may be divided into three unit electrodes in each block BK. The three unit electrodes disposed on the same level may be electrically isolated from each other such as previously described.

Figure 26:
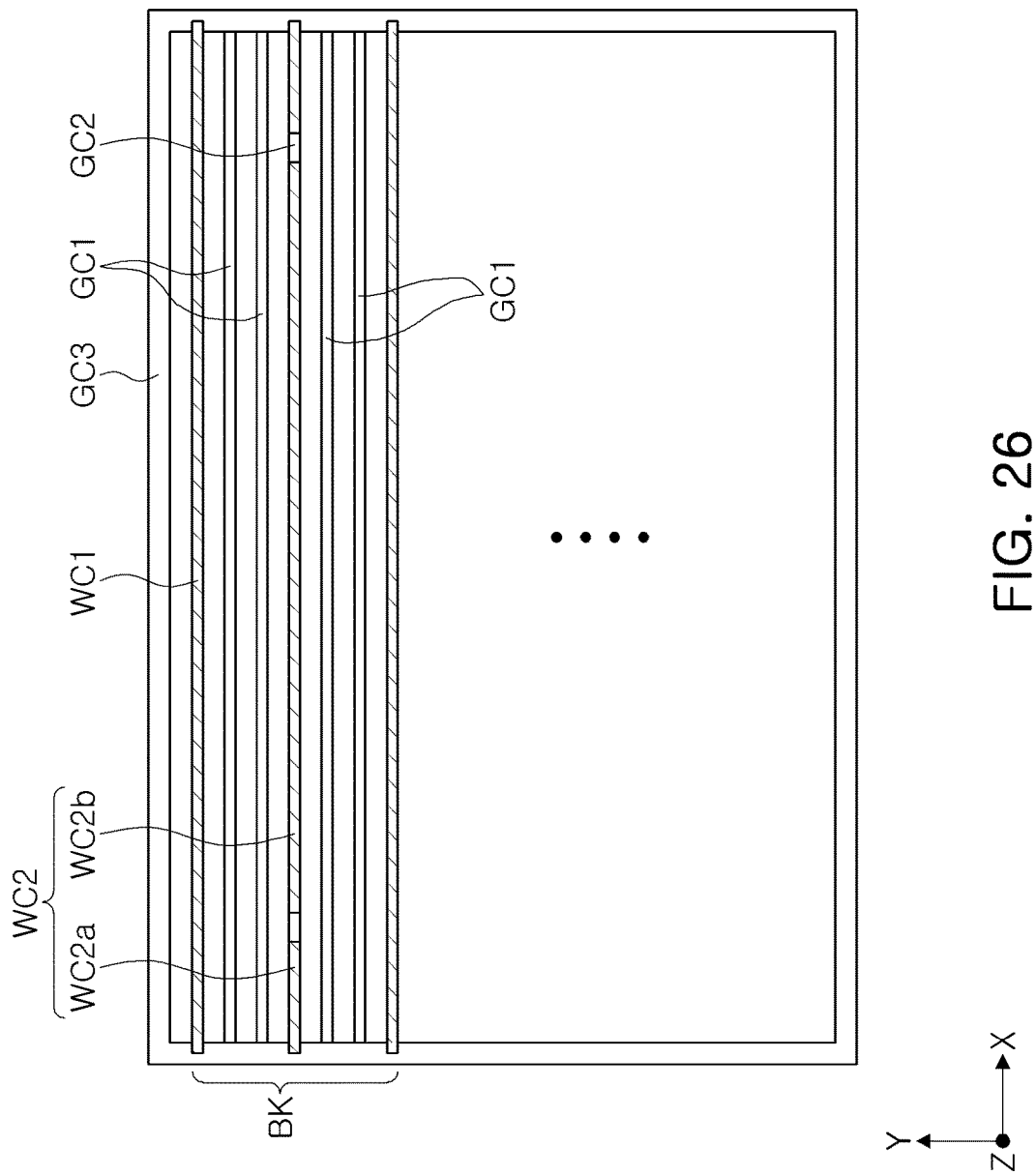
FIG. 26 illustrates a view of a layout of a memory device according to another embodiment of the inventive concept.
Figure 27:
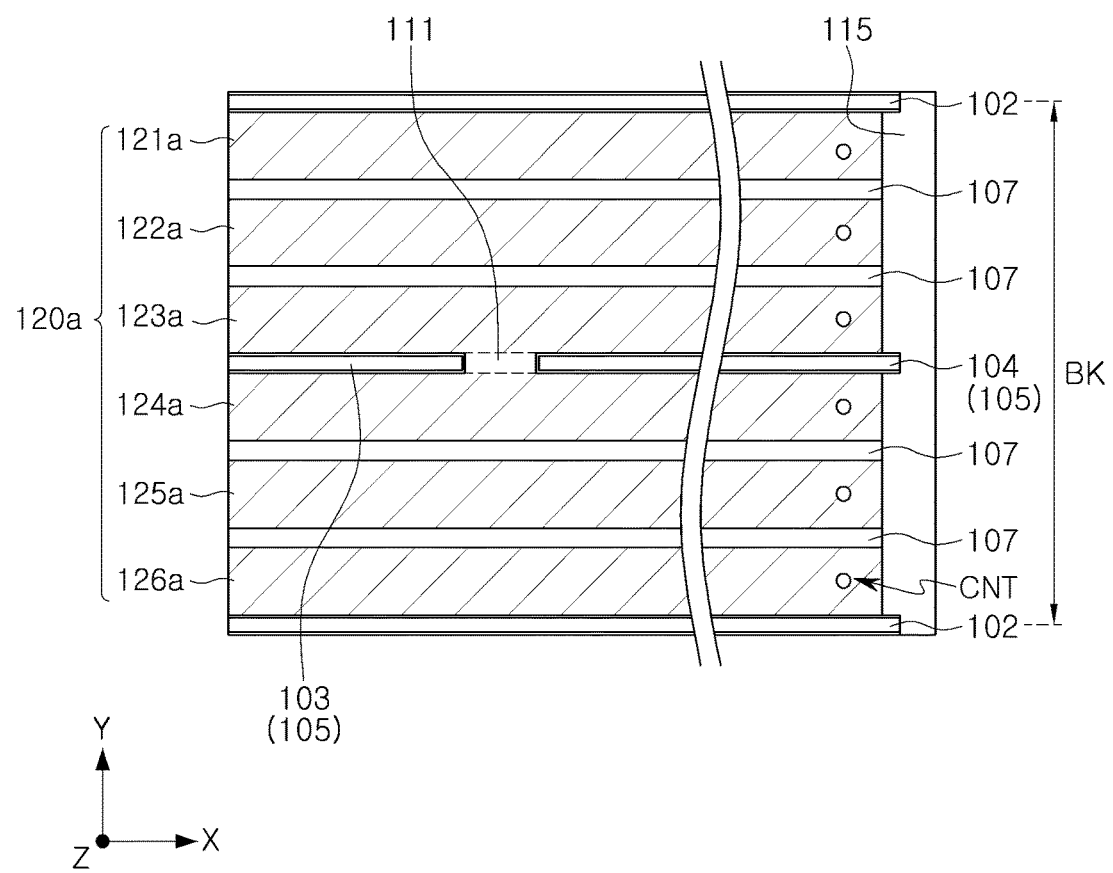
FIG. 27 illustrates a top view of a gate electrode layer included in the memory device of FIG. 26.

FIG. 26 illustrates a view of a layout of a memory device according to another embodiment of the inventive concept. FIG. 27 illustrates a top view of a gate electrode layer included in the memory device of FIG. 26.

With reference to FIG. 26, four first ground select line cuts GC1 are disposed in the single block BK, while a single second word line cut WC2 (including portions WC2a and WC2b) is disposed in the middle between a first pair of the first ground select line cuts GC1 and a second pair of the first ground select line cuts GC1 disposed in a block BK.

With reference to FIG. 27, in each block BK defined by a pair of common source lines 102, the gate electrode layer 120a is divided into six unit electrodes 121a, 122a, 123a, 124a, 125a, and 126a by first separation insulating patterns 107, the second separation insulating pattern 111, and the first conductive line 105. The six unit electrodes 121a, 122a, 123a, 124a, 125a, and 126a function as six GSLs included in each block BK. Each of a first unit electrode 121a, a second unit electrode 122a, a third unit electrode 123a, a fourth unit electrode 124a, a fifth unit electrode 125a, and a sixth unit electrode 126a are connected to contact plugs CNT. In other words, in each block BK, a voltage may be supplied to each of the six GSLs, separately.

Since the descriptions of the first conductive line 105, the first separation insulating patterns 107, the second separation insulating pattern 111, and the third separation insulating pattern 115 are the same as the description provided with reference to FIG. 15, further descriptions thereof will be omitted. Different gate electrode layers 120f, 120g, 120h, 120i, and 120j (not shown) functioning as WLs as described in previous embodiments, may be divided into two unit electrodes in each block BK. The two unit electrodes disposed on the same level may be connected by connection electrodes 120f, 120g, 120h, 120i, and 120j, such as previously described.

Figure 28:
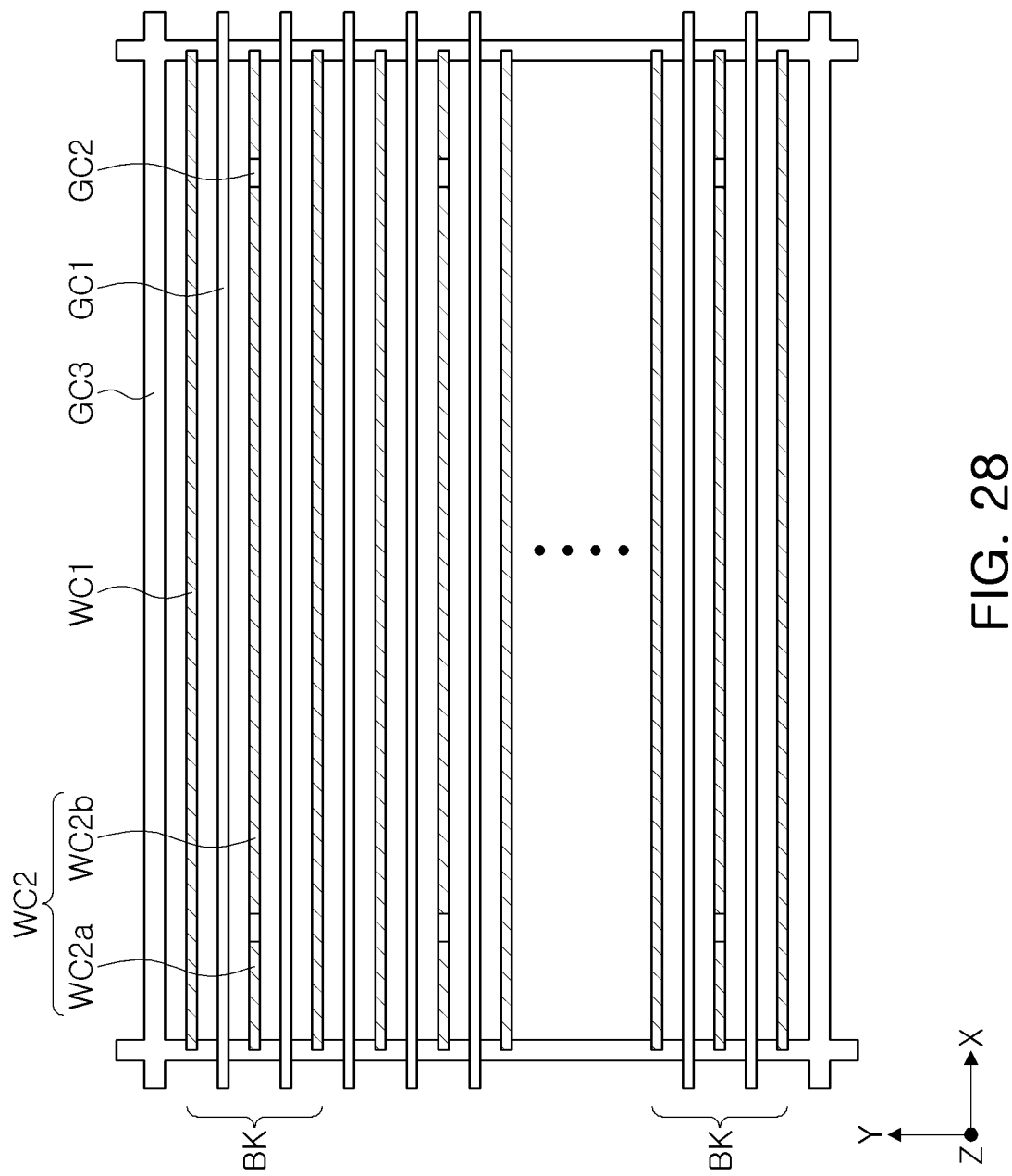
FIG. 28 illustrates a view of a layout of a memory device according to another embodiment of the inventive concept.
Figure 29:
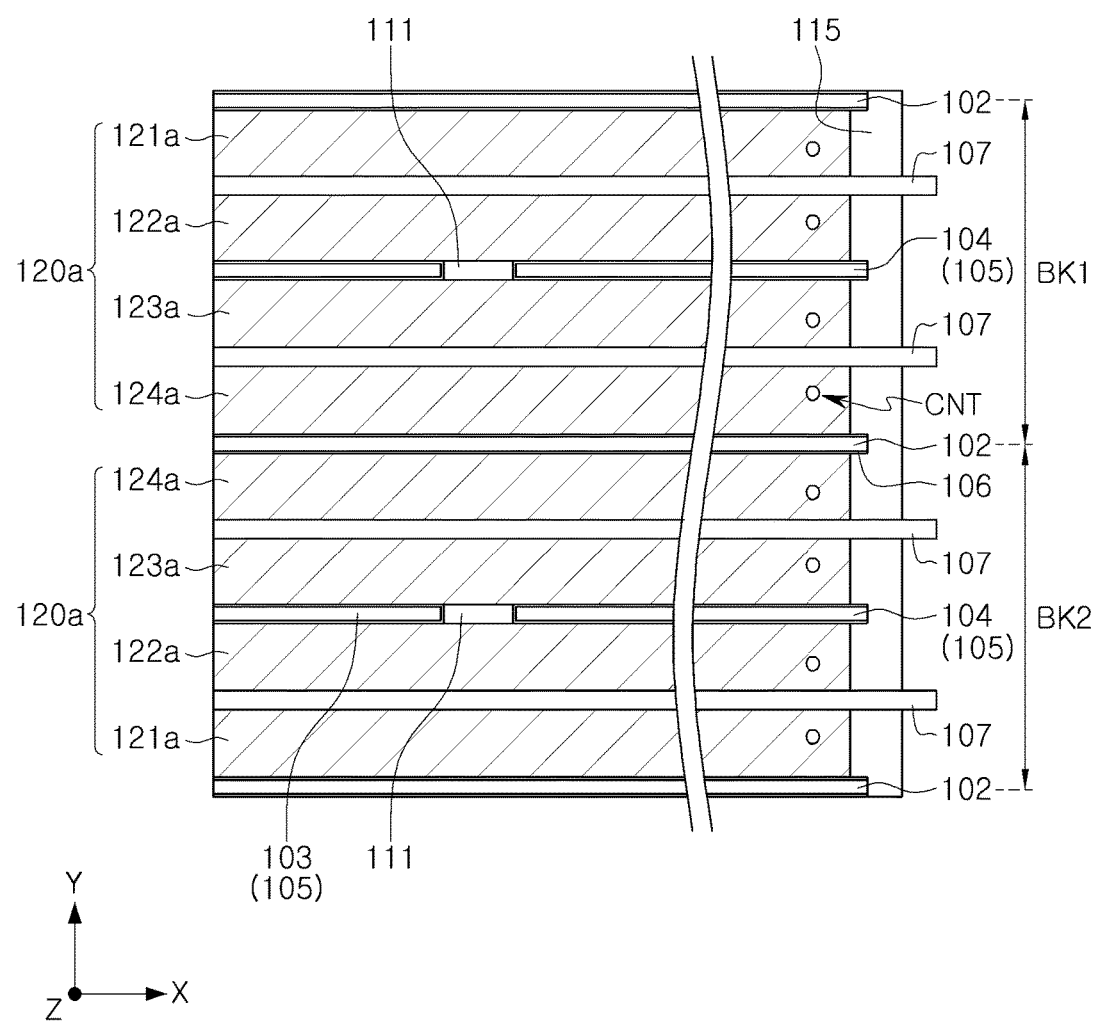
FIG. 29 illustrates a top view of a gate electrode layer included in the memory device of FIG. 28.

FIG. 28 illustrates a view of a layout of a memory device according to an embodiment of the inventive concept. FIG. 29 illustrates a top view of a gate electrode layer included in the memory device of FIG. 28.

The layout of the memory device shown in FIG. 28 is similar to the layout of the memory device shown in FIG. 2, wherein like reference numerals correspond to like features and detailed description of such like features are omitted. Compared to a view of the layout illustrated in FIG. 2, the layout illustrated in FIG. 28 is however different in that the first ground select line cuts GC1 are extended to intersect a third ground select line cut GC3, and vertex portions (i.e., the corners) of the third ground select line cut GC3 are configured to have a cross-like shape in the x-y plane. Therefore, in a manner different than the first separation insulating patterns 107 illustrated in FIG. 15, the first separation insulating patterns 107 illustrated in FIG. 29 are formed to intersect (overlap) the third separation insulating pattern 115 disposed to be in contact with an end portion of the gate electrode layer 120a.

Figure 30:
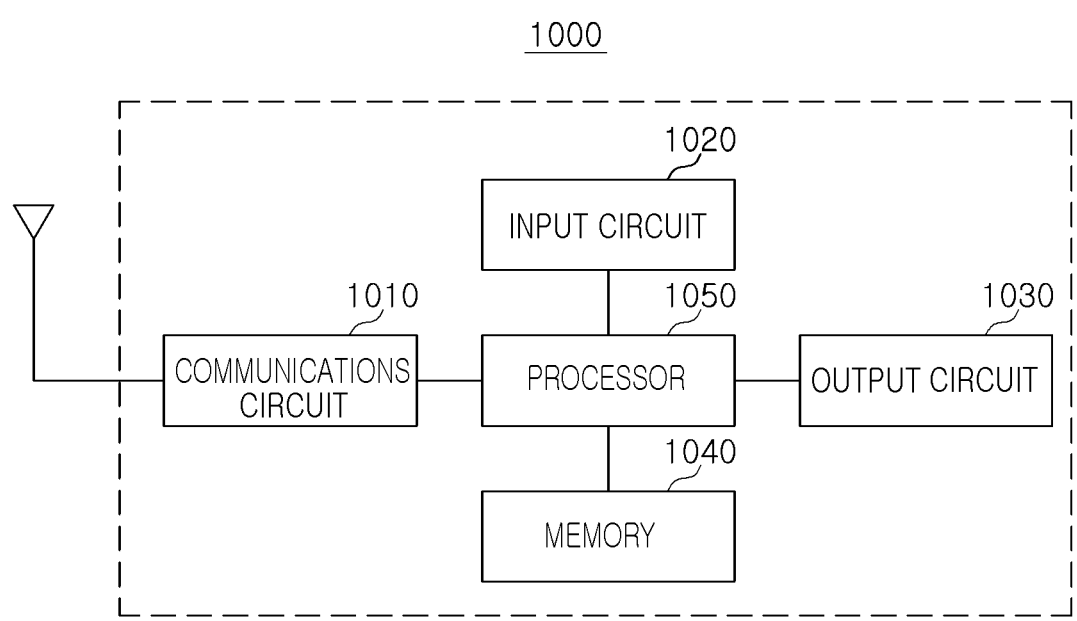
FIG. 30 illustrates a block diagram of an electronic device including a memory device according to an embodiment of the inventive concept.

FIG. 30 illustrates a block diagram of an electronic device including a memory device according to an embodiment of the inventive concept.

With reference to FIG. 30, an electronic device 1000 includes a communications circuit 1010, an input circuit 1020, an output circuit 1030, a memory 1040, and a processor 1050.

The communications circuit 1010 may include a wired/wireless communications module, for example a wireless Internet module, a near field communications module, a global positioning system (GPS) module, a mobile communications module, or the like. The wired/wireless communications module included in the communications circuit 1010 may transmit and receive data by being connected to external communications networks according to various communications standards.

The input circuit 1020 may be provided as a module provided for users to control operations of the electronic device 1000, and may include a mechanical switch, a touchscreen, a voice recognition module, and the like. In addition, the input circuit 1020 may also include a finger mouse device or a mouse operated using a trackball, and/or a laser pointer, as well as other various types of input devices. The input circuit 1020 may further include various sensor modules by which users may input data.

The output circuit 1030 may output information processed in the electronic device 1000 in the form of audio or video, while the memory 1040 may store a program, data, or the like, to process and control the processor 1050. The memory 1040 may include one or more memory devices 100 and/or 100A, according to various embodiments described above, while the processor 1050 may store as well as output data by sending a command to the memory 1040 according to required operations.

The memory 1040 may communicate with the processor 1050 through an interface embedded in the electronic device 1000 or a separate interface. In a case in which the memory 1040 communicates with the processor 1050 through a separate interface, the processor 1050 may store data in or output data from the memory 1040 through various interface standards, such as for example secure digital (SD), secure digital high capacity (SDHC), secure digital extended capacity (SDXC), MICRO SD, universal serial bus (USB), and the like.

The processor 1050 may control operations of respective units included in the electronic device 1000. The processor 1050 may perform for example control and process operations relating to voice calls, video calls, data communications, and the like, or may perform control and process operations to play and manage multimedia. In addition, the processor 1050 may process inputs sent by a user through the input circuit 1020, and may output the results through the output circuit 1030. Furthermore, the processor 1050 may store data required to control operations of the electronic device 1000 in the memory 1040 or output the data therefrom, as described above. Also, it should be understood that the various blocks and/or circuits shown and described with respect to FIG. 30 may be implemented by dedicated hardware, or by a processor (e.g., one or more programmed microprocessors and associated circuitry), or by a combination of dedicated hardware to perform some functions of the block and a processor to perform other functions of the block.

As set forth above, according to the embodiments of the inventive concept, a memory device may provide a plurality of blocks including a plurality of ground select lines disposed to be spaced apart from each other. Therefore, read disturb may be reduced, and reliability of the memory device may be improved.

While example embodiments have been shown and described above, it will be apparent to those skilled in the art that modifications and variations could be made without departing from the scope of the present inventive concept as defined by the appended claims.

What is claimed is:

1. A memory device, comprising:
a pair of common source lines disposed on a substrate spaced apart from each other and extending in a first direction;
a plurality of ground select lines disposed between the pair of common source lines, extending in the first direction, and disposed on a same first level;
a plurality of word lines disposed above the plurality of ground select lines between the pair of common source lines, extending in the first direction, and disposed on a same second level, at least a portion of the plurality of word lines being connected by a connection electrode;
a plurality of string select lines disposed between the pair of common source lines, extending in the first direction, and disposed on a same third level;
a plurality of first separation insulating patterns disposed between individual ground select lines from among the plurality of ground select lines and extending in the first direction; and
a plurality of second separation insulating patterns disposed between individual string select lines from among the plurality of string select lines and extending in the first direction,
wherein the plurality of second separation insulating patterns are disposed to overlap the plurality of first separation insulating patterns vertically.

2. The memory device of claim 1, wherein the plurality of second separation insulating pattern are shorter than the plurality of first separation insulating patterns.

3. The memory device of claim 1, further comprising at least one third separation insulating pattern disposed between other individual ground select lines from among the plurality of ground select lines, the at least one third separation insulating pattern being shorter than the plurality of first separation insulating patterns and disposed to overlap the connection electrode.

4. The memory device of claim 3, further comprising mold insulating layers disposed between the plurality of ground select lines and the plurality of word lines, wherein the plurality of first separation insulating patterns and the at least one third separation insulating pattern comprises a material different than a material of the mold insulating layers.

5. The memory device of claim 3, further comprising at least one first conductive line extending in the first direction and divided into a first portion and a second portion by the connection electrode and the at least one third separation insulating pattern.

6. The memory device of claim 5, wherein the at least one first conductive line comprises two first conductive lines, and the two first conductive lines are disposed between the plurality of first separation insulating patterns.

7. The memory device of claim 6, wherein a word line from among the plurality of word lines and disposed in a central region of the plurality of word lines, overlaps a single ground select line from among the plurality of ground select lines, and respective different word lines from among the plurality of word lines overlap two ground select lines from among the plurality of ground select lines.

8. The memory device of claim 5, wherein one of the plurality of first separation insulating patterns is disposed between one of the pair of common source lines and the at least one first conductive line, and another one of the plurality of first separation insulating patterns is disposed between another one of the pair of common source lines and the at least one first conductive line.

9. The memory device of claim 5, further comprising at least one second conductive line disposed between individual ground select lines from among the plurality of ground select lines and extending in the first direction.

10. The memory device of claim 9, wherein the at least one first conductive line and the at least one second conductive line are disposed between the plurality of first separation insulating patterns.

11. The memory device of claim 10, wherein a word line from among the plurality of word lines and disposed in a central region of the plurality of word lines overlaps a single ground select line from among the plurality of ground select lines, and respective different word lines from among the plurality of word lines overlap two ground select lines.

12. The memory device of claim 1, wherein the plurality of ground select lines are disposed spaced apart from each other in a second direction perpendicular to the first direction, and each of the plurality of ground select lines are disposed spaced apart from each other in the first direction.

13. The memory device of claim 1, comprising a dummy channel structure extending in a direction perpendicular to an upper surface of the substrate and penetrating through at least a portion of the plurality of word lines, wherein the dummy channel structure is disposed to overlap the plurality of first separation insulating patterns.

14. A memory device, comprising:
a pair of common source lines disposed on a substrate spaced apart from each other and extending in a first direction;
a plurality of ground select lines disposed between the pair of common source lines, extending in the first direction, and disposed on a same first level;
a plurality of word lines disposed above the plurality of ground select lines between the pair of common source lines and disposed on a same second level;
a plurality of string select lines disposed between the pair of common source lines, extending in the first direction, and disposed on a same third level;
a plurality of first separation insulating patterns disposed between individual ground select lines from among the plurality of ground select lines;
a plurality of second separation insulating patterns disposed between individual string select lines from among the plurality of string select lines; and
a dummy channel structure extending in a direction perpendicular to an upper surface of the substrate and penetrating through at least a portion of the plurality of word lines,
wherein the dummy channel structure is disposed to overlap the plurality of first separation insulating patterns, and
wherein the plurality of second separation insulating patterns are disposed to overlap the plurality of first separation insulating patterns vertically.

15. The memory device of claim 14, wherein at least a portion of the plurality of word lines are connected by a connecting electrode.

16. The memory device of claim 14, comprising at least one conductive line disposed between individual ground select lines from among the plurality of ground select lines, disposed between the plurality of first separation insulating patterns, and extending in the first direction.

17. The memory device of claim 14, wherein a single word line from among the plurality of word lines overlaps a single ground select line, and respective different word lines from among the plurality of word lines overlap two ground select lines.

18. A memory device comprising:
- a pair of common source lines disposed on a substrate spaced apart from each other and extending in a first direction;
- a plurality of ground select lines disposed between the pair of common source lines, extending in a first direction and disposed on a same first level;
- a plurality of first word lines disposed above the plurality of ground select lines between the pair of common source lines, and disposed on a same second level;
- a plurality of second word lines disposed above the plurality of first word lines between the pair of common source lines, and disposed on a same third level;
- a plurality of string select lines disposed between the pair of common source lines, extending in a first direction and disposed on a same fourth level;
- a plurality of first separation insulating patterns disposed between individual ground select lines from among plurality of ground select lines and extending in the first direction and disposed on the same first level; and
- a plurality of second separation insulating patterns disposed between individual string select lines from among plurality of string select lines and extending in the first direction and disposed on the same fourth level,
- wherein at least one of the plurality of first word lines includes a portion that extends along the first direction beyond a corresponding one of the plurality of second word lines directly above the at least one of the plurality of first word lines, and
- wherein the plurality of second separation insulating patterns are disposed to overlap the plurality of first separation insulating patterns vertically.

19. The memory device of claim 18, wherein the pair of common source lines also extend in a direction perpendicular to an upper surface of the substrate penetrating through at least a portion of the plurality of ground select lines, a portion of the plurality of first word lines and a portion of the plurality of second word lines.

20. The memory device of claim 16, wherein at least a portion of the plurality of first word lines are connected by a first connecting electrode, and at least a portion of the plurality of second word lines are connected by a second connecting electrode.

* * * * *